United States Patent
Oki

(10) Patent No.: US 7,349,240 B2
(45) Date of Patent: Mar. 25, 2008

(54) SEMICONDUCTOR MEMORY DEVICE HAVING REDUCED LEAKAGE CURRENT

(75) Inventor: Yasumitsu Oki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 20 days.

(21) Appl. No.: 11/337,558

(22) Filed: Jan. 24, 2006

(65) Prior Publication Data

US 2006/0164881 A1 Jul. 27, 2006

(30) Foreign Application Priority Data

Jan. 26, 2005 (JP) .............................. 2005-017739

(51) Int. Cl.
*G11C 11/00* (2006.01)
(52) U.S. Cl. ................ 365/154; 365/63; 365/189.11; 365/210
(58) Field of Classification Search ................ 365/63, 365/154, 210, 189.11
See application file for complete search history.

(56) References Cited

U.S. PATENT DOCUMENTS 6,977,834 B2 * 12/2005 Onizawa et al. .............. 365/63
7,054,864 B1 * 5/2006 Toomey ...................... 707/10

FOREIGN PATENT DOCUMENTS

| JP | 61-214559 A | 9/1986 |
| JP | 7-176631 A | 7/1995 |
| JP | 2004-71118 A | 3/2004 |

* cited by examiner

*Primary Examiner*—Hoai V. Ho
(74) *Attorney, Agent, or Firm*—Sughrue Mion, PLLC

(57) ABSTRACT

A static semiconductor memory device includes a memory cell formed in a memory cell region; and a dummy memory cell formed in a dummy memory cell region. The memory cell includes a power supply wiring and a ground wiring which are provided to extend in a direction of a word line; and inverters provided between the power supply wiring and the ground wiring and cross-connected to each other. The dummy memory cell includes first and second wirings respectively corresponding to the power supply wiring and the ground wiring and extending in the direction of the word line; and two sets of a dummy load circuit and a dummy drive transistor, wherein the two sets are connected with the first and second wirings, which are biased to prevent leakage current from flowing.

20 Claims, 25 Drawing Sheets

100: MEMORY CELL

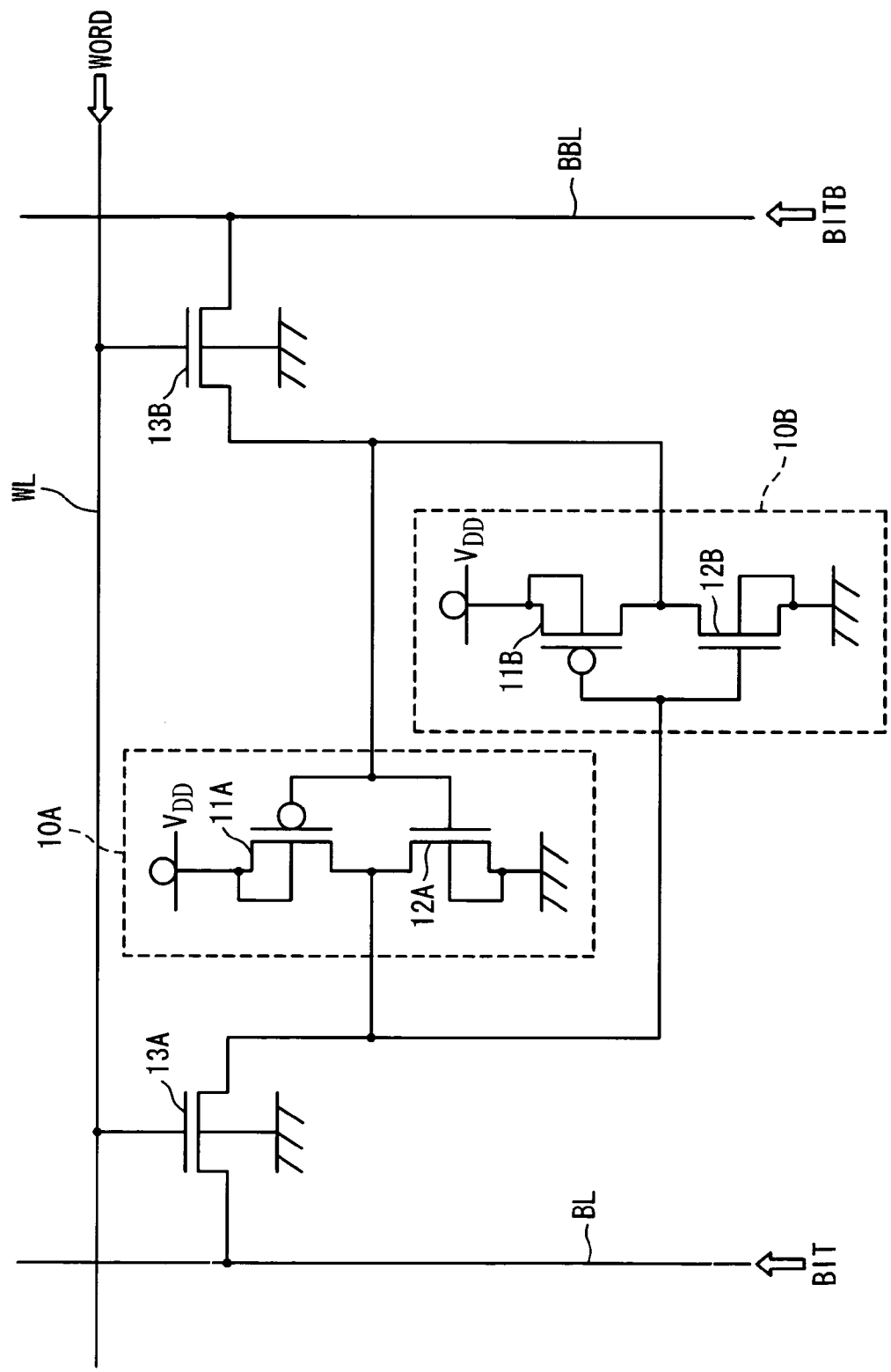

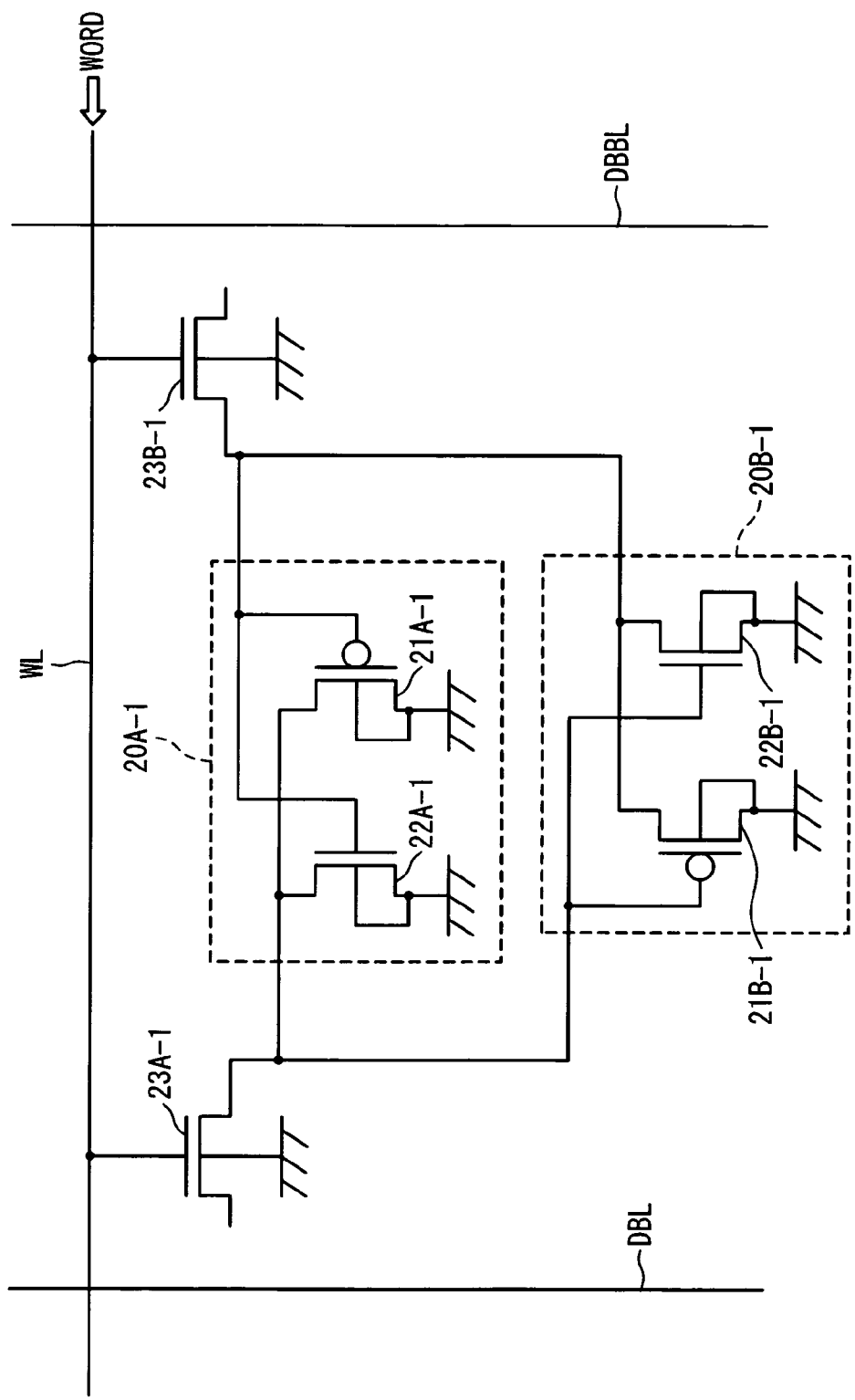
Fig. 3  201: DUMMY MEMORY CELL

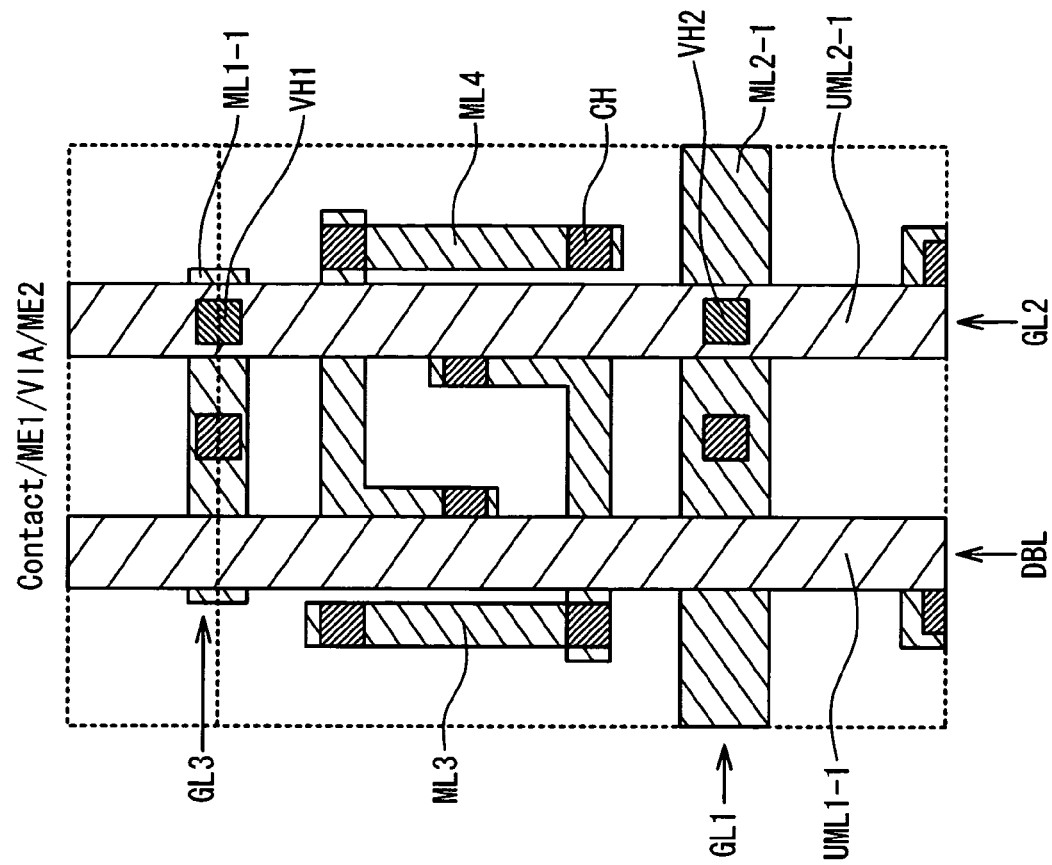
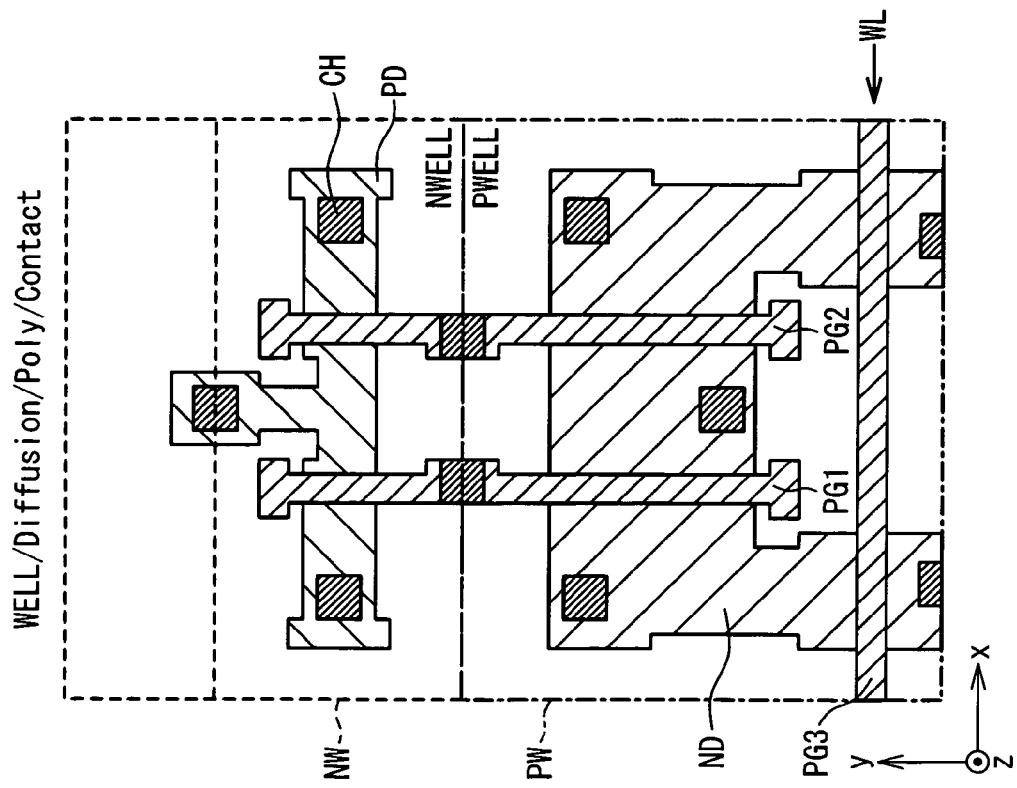

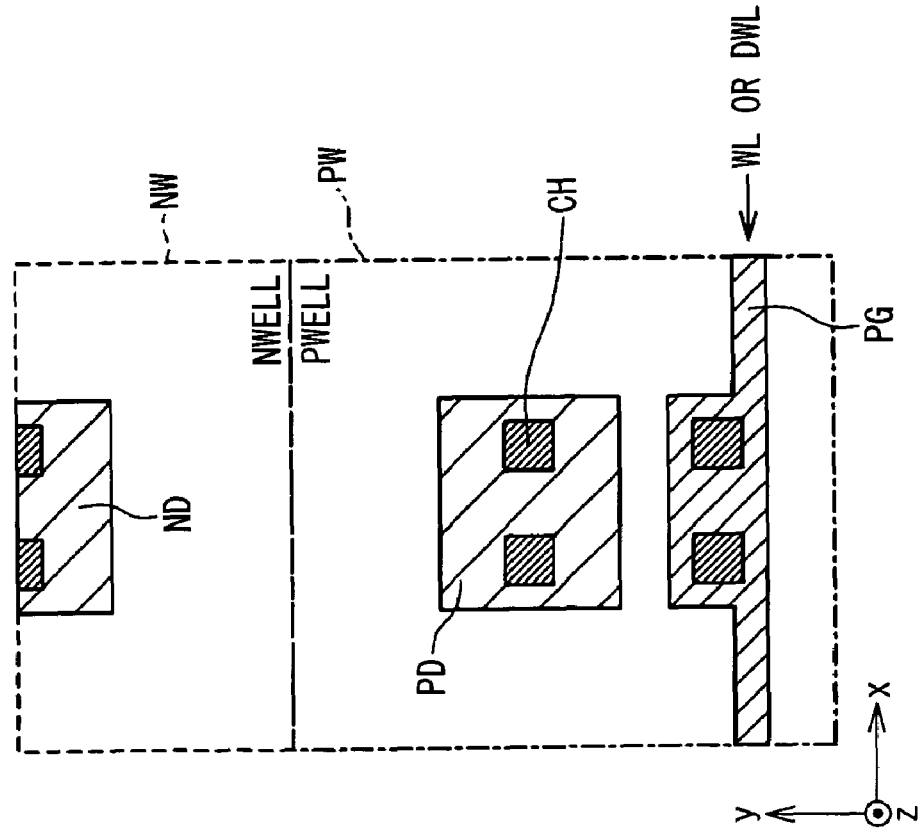
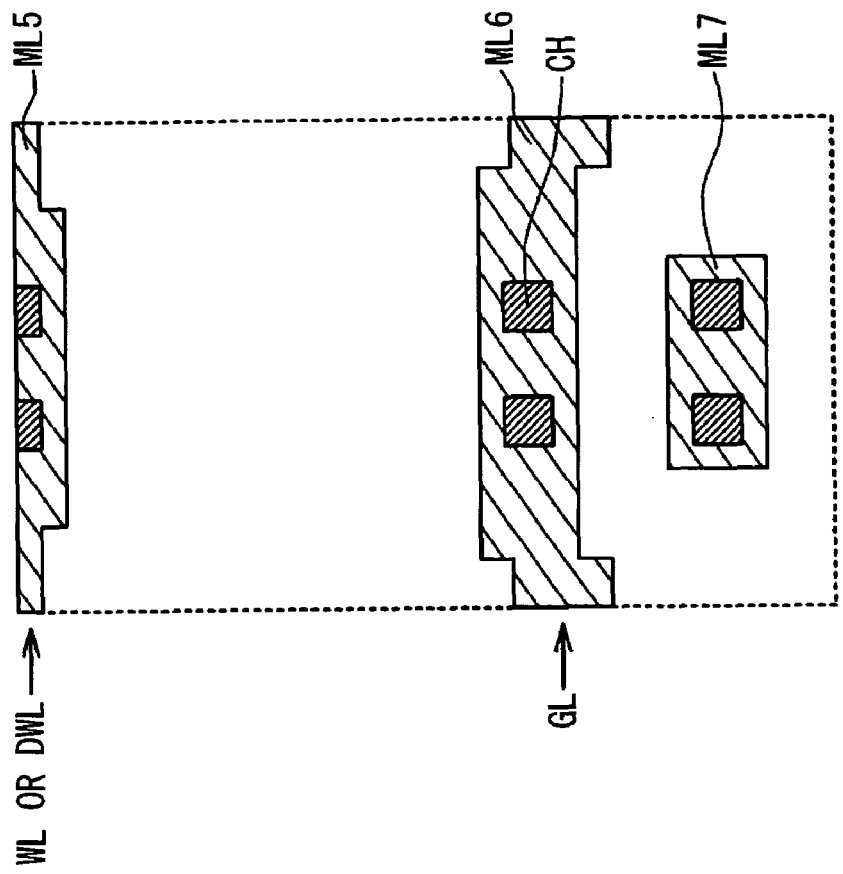

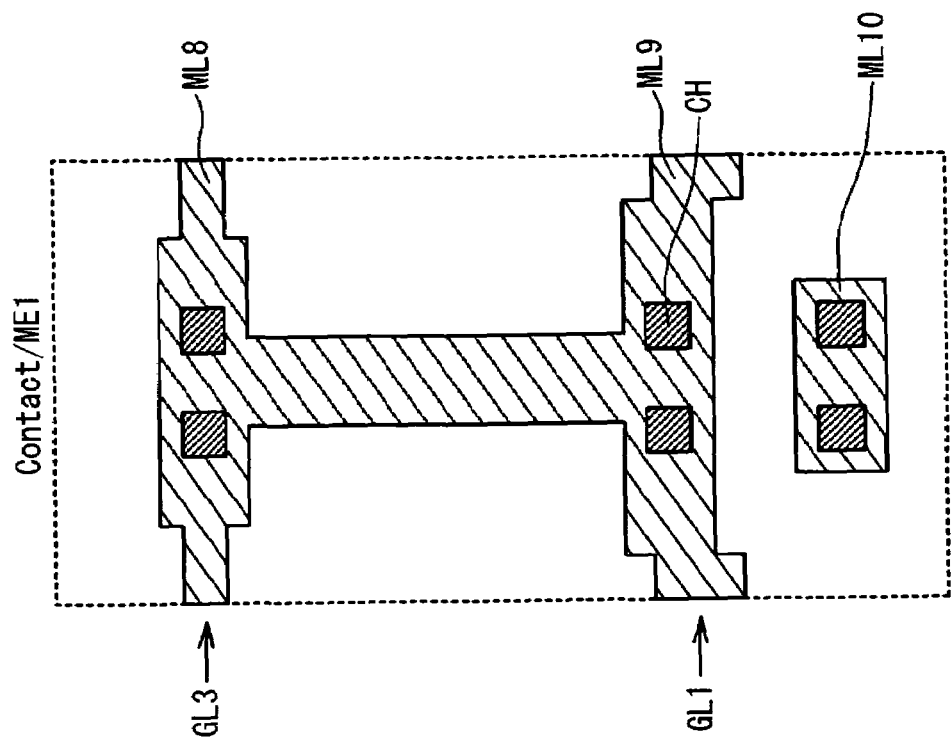
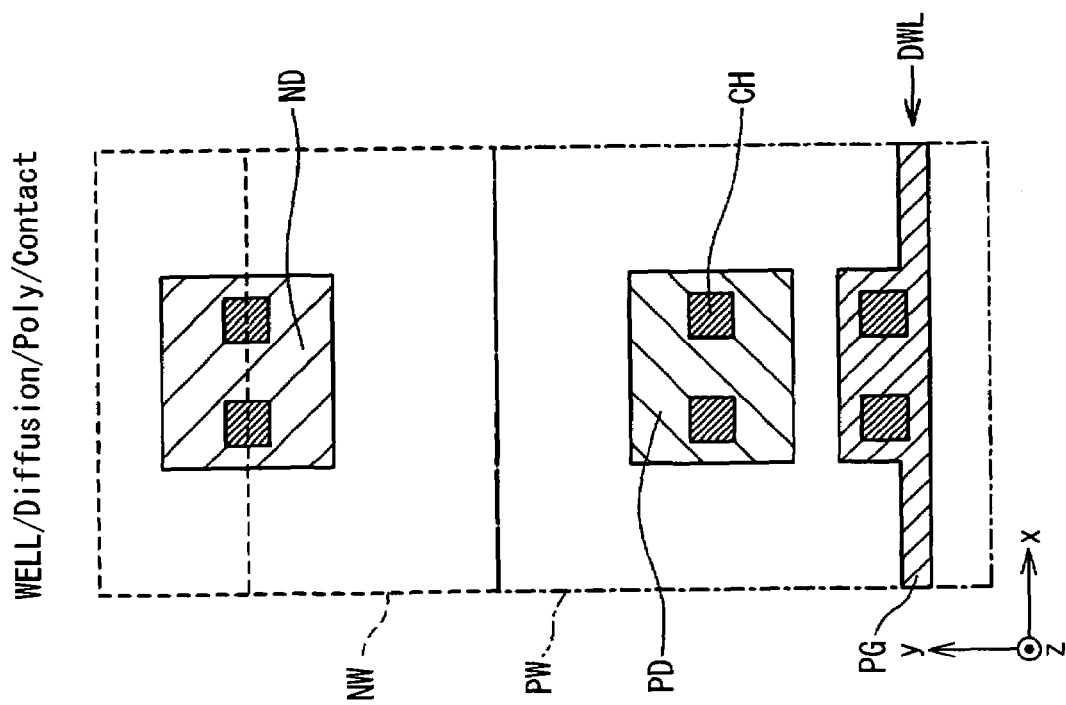

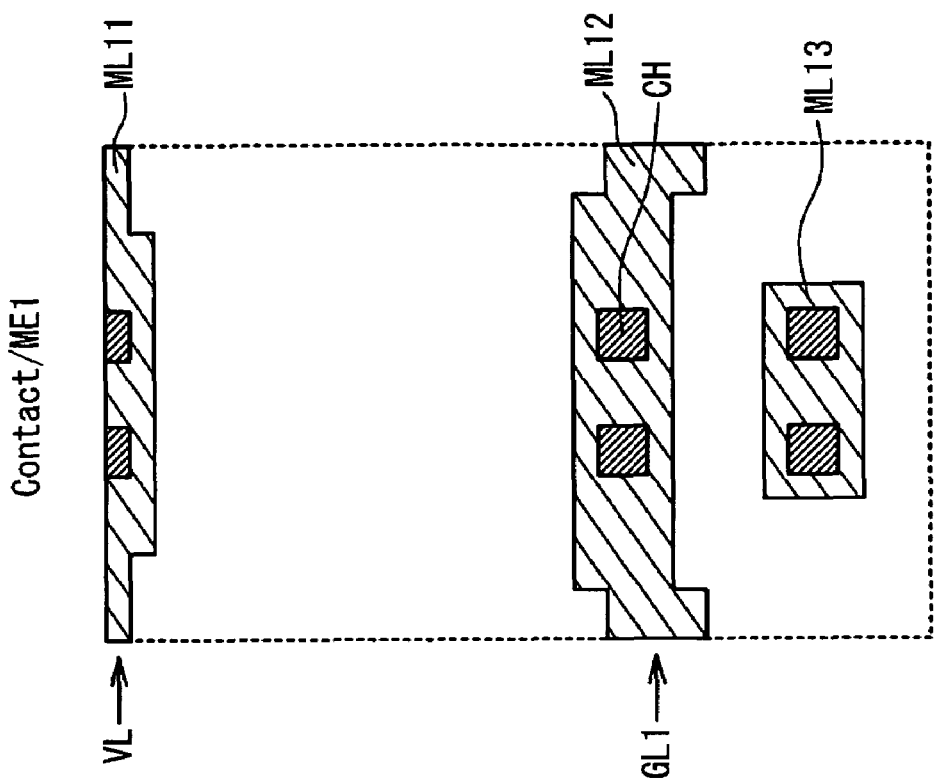
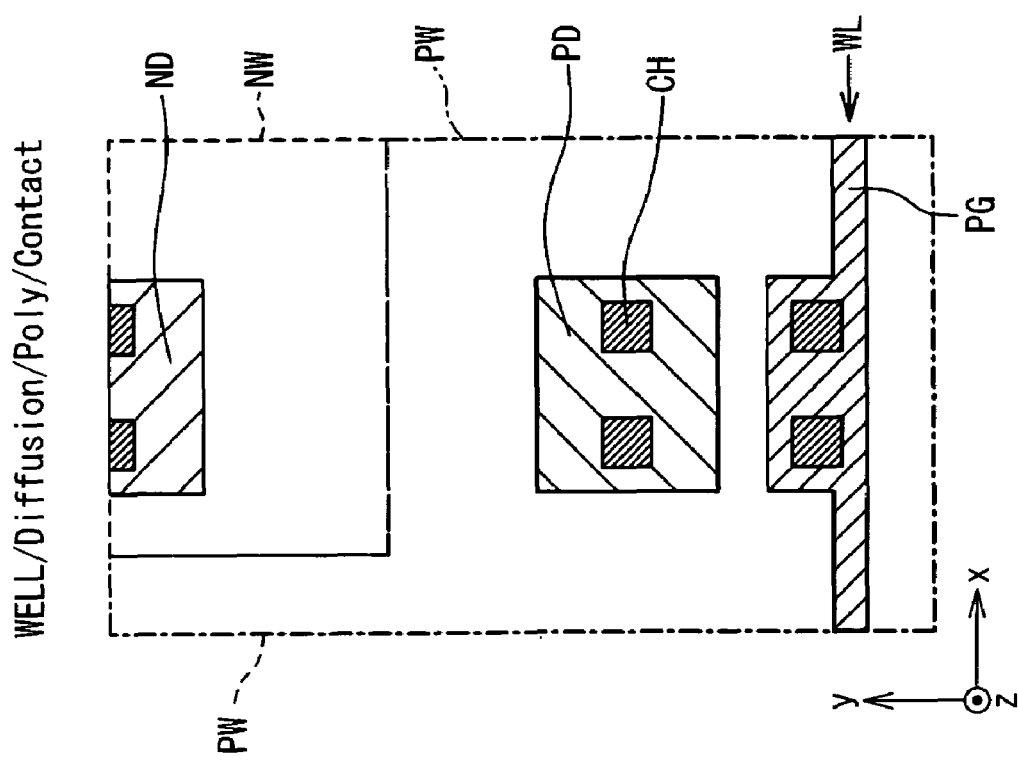

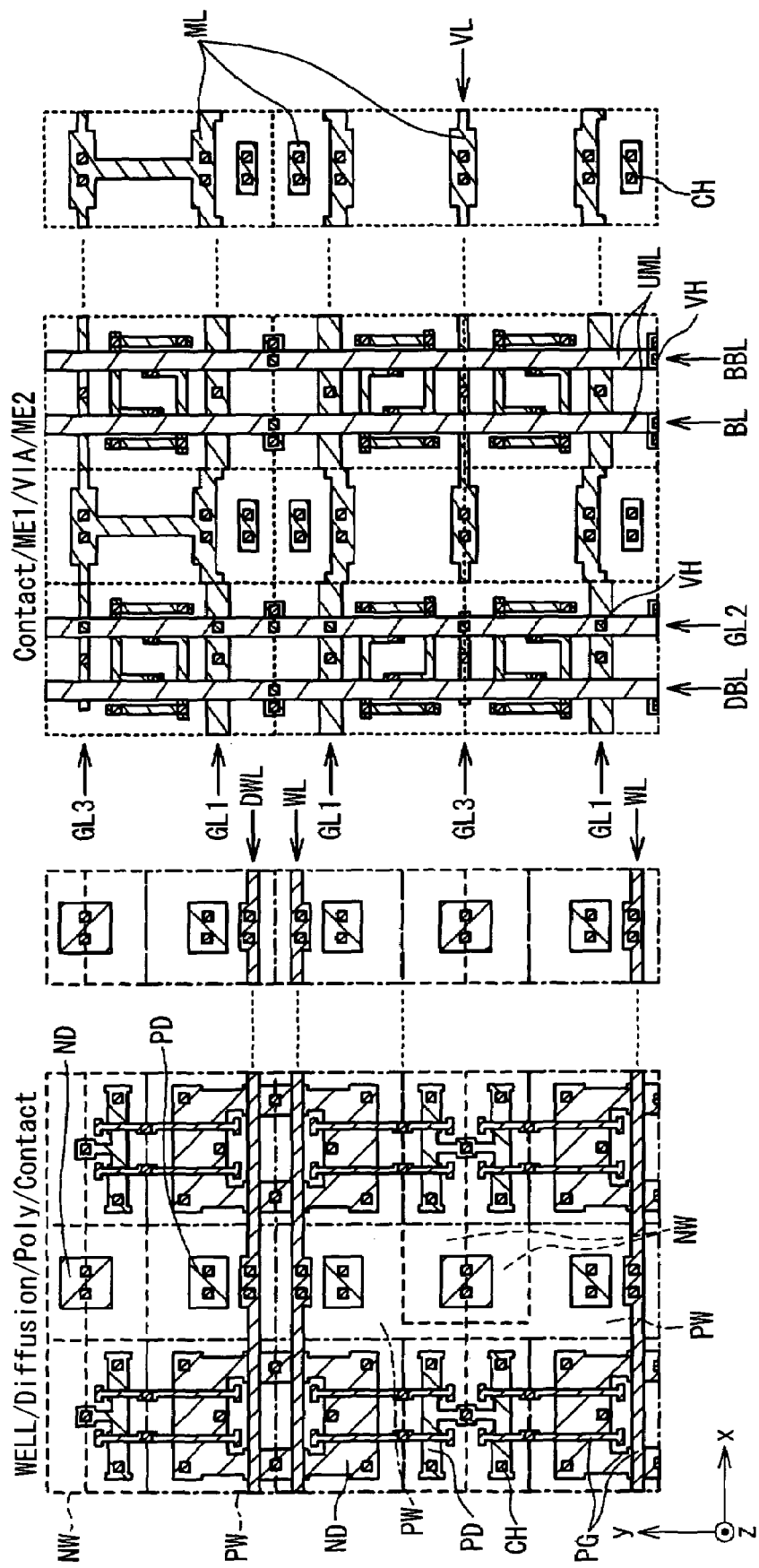

203: DUMMY MEMORY CELL

212: DUMMY MEMORY CELL

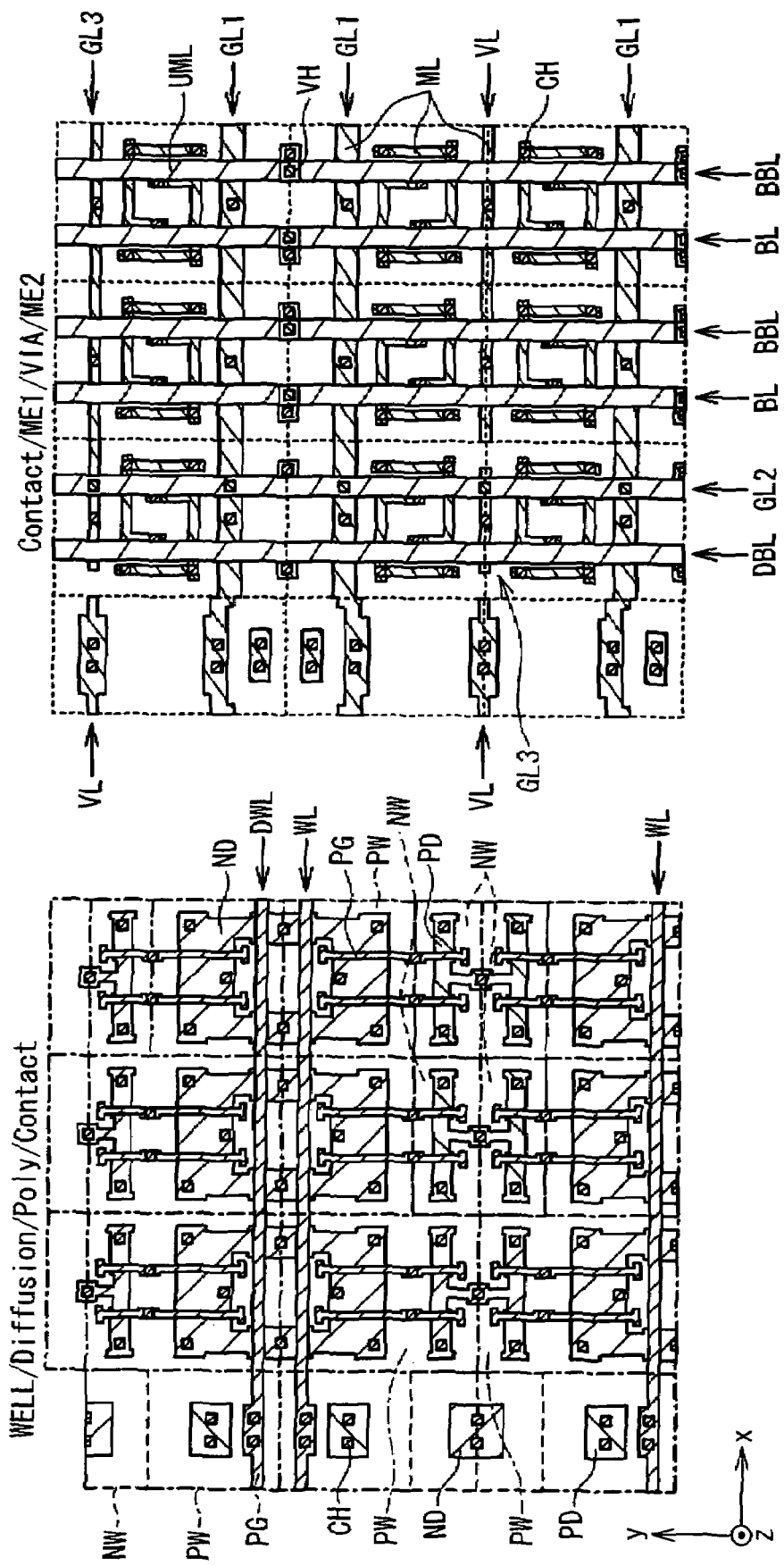

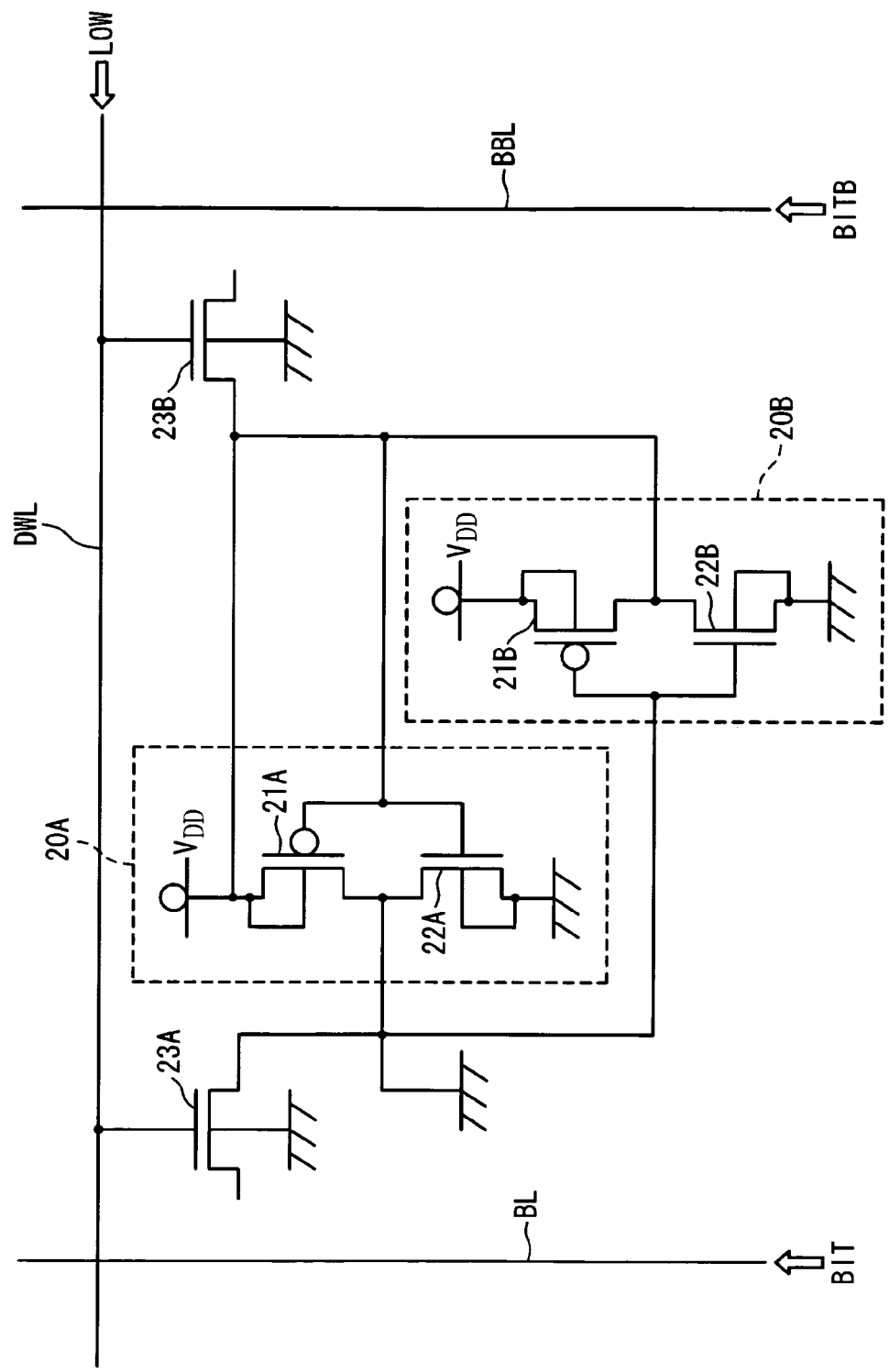
Fig. 22 210: DUMMY MEMORY CELL

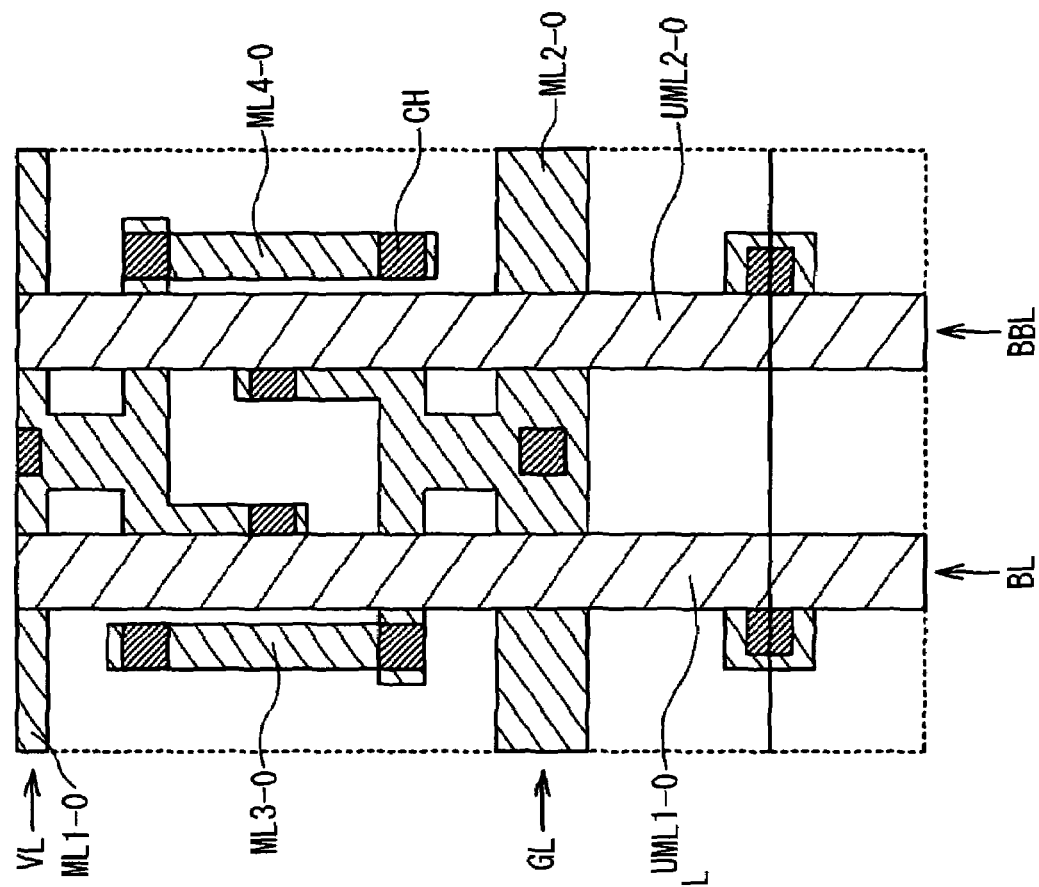
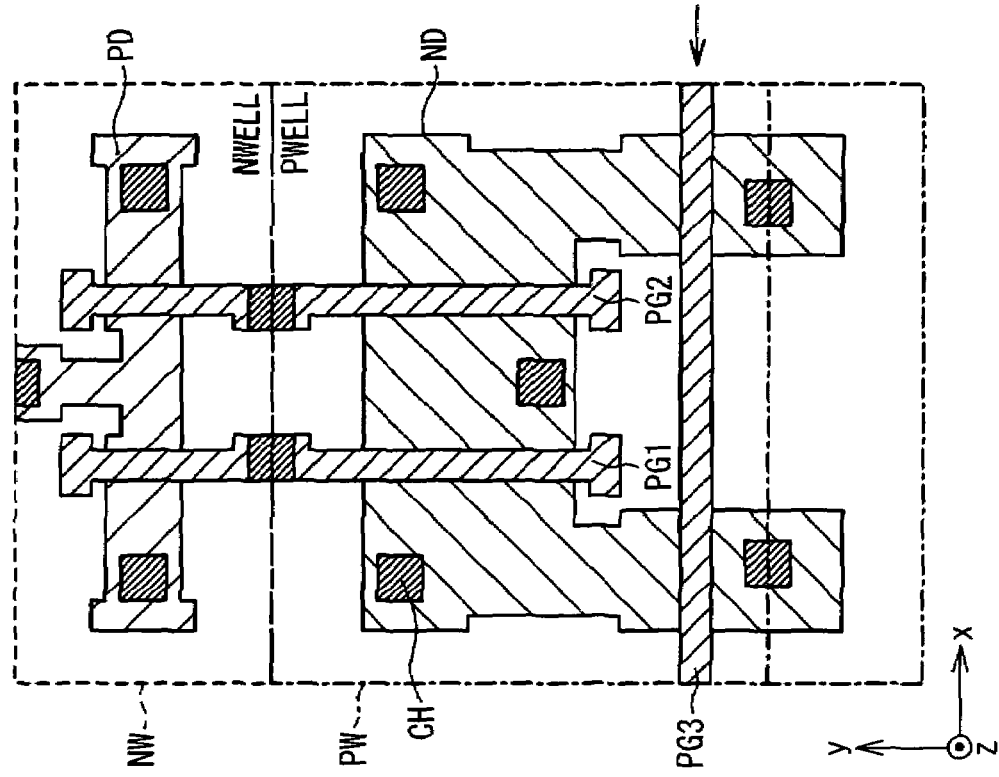
Fig. 23A
Fig. 23B

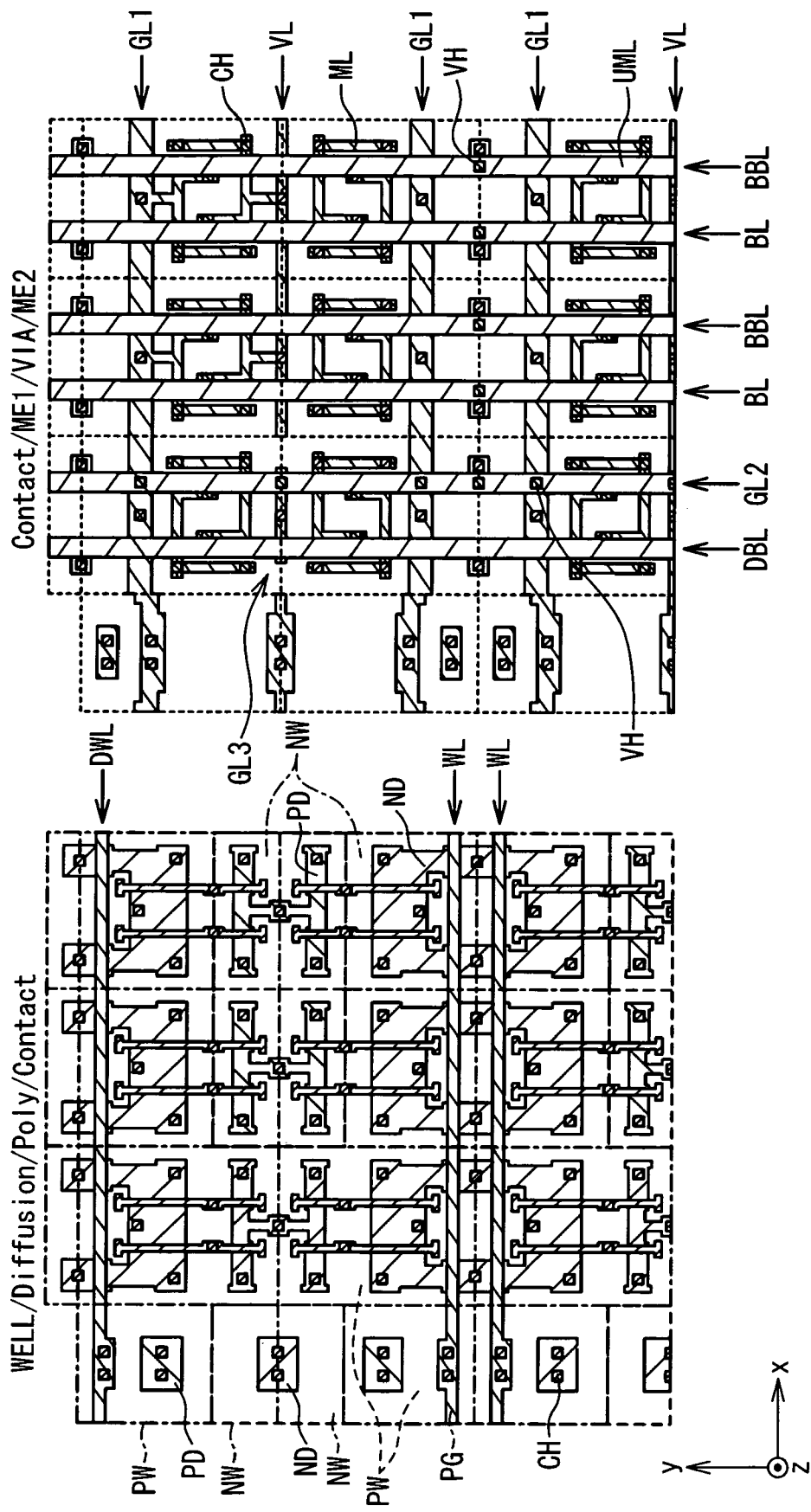

SEMICONDUCTOR MEMORY DEVICE HAVING REDUCED LEAKAGE CURRENT

BACKGROUND OF THE INVENTION

1. Field of the Invention

The present invention relates to a static semiconductor memory device and, more particularly, to a static semiconductor memory device, in which degradation of device quality or reduction of operational margin can be prevented.

2. Description of the Related Art

In an SRAM, dummy memory cells that cannot function as memory cells are arranged around the memory cells in order to reduce a defect rate of the memory cells due to a non-coincidence of the dimension of a pattern or an incorrect shape of the pattern after a lithography process through an abrupt change in device density. Naturally, the dummy memory cell induces the incorrect pattern shapes of polysilicon gates or contact holes due to a proximity effect, compared with the memory cell. As a consequence, the dummy memory cells are designed to be separated from the memory cells from the viewpoint of circuit logic, so as to avoid any adverse influence on a normal functional operation of the memory cells.

The dummy memory cell has a layout structure similar to that of the memory cell to keep the continuity of a layout. In particular, it is desired that the dummy memory cell has the arrangement or shapes of a well, a diffusion layer, a polysilicon gate, a contact hole, a metal wiring and a via-contact identical to or similar to those of the memory cell. As a consequence, the circuit configuration of the dummy memory cell is equivalent to that of the memory cell.

Japanese Laid Open Patent Application (JP-A-Showa 61-214559) discloses the arrangement of dummy memory cells around memory cells. In this first conventional example, the dummy memory cells without any operation are arranged in a boundary between a region where the memory cells are continuously arranged, and another region where the memory cells are not continuously arranged. Also, Japanese Laid Open Patent Application (JP-A-Heisei 7-176631) as a second conventional example discloses a technique for using a dummy transistor in a dummy memory cell as a pull-up transistor to keep a bit line at a predetermined voltage. Moreover, Japanese Laid Open Patent Application (JP-P2004-071118A) as a third conventional example discloses an SRAM, in which a voltage decrease rate of a dummy bit line is higher than that of a bit line. In this third conventional example, a P-channel MOS transistor for a load in a memory cell is replaced with an N-channel MOS transistor. Also, a power supply voltage is applied to a memory node, and a ground voltage GND is applied to a source of the N-channel MOS transistor. A current flows out on a line of the ground voltage from a dummy bit line when a word line is raised up to an "H" level, thereby improving the operational margin of the SRAM.

However, in the conventional SRAMs, since power is supplied to a dummy memory cell from a power supply voltage VDD, a leakage current flows in a normal dummy memory cell although it is slight. In addition, although the dummy memory cell is permitted to have an abnormal shape, an unexpected current possibly flows. Specifically, various defects could be considered such as a short-circuit between a source and a drain in a transistor due to defect of a polysilicon gate, a short-circuit between the source and the drain due to the excessive formation of a diffusion layer, a short-circuit between the power supply voltage and a substrate voltage due to the defect of a metal wiring. In the conventional examples, a memory cell, a dummy memory cell and a Tap cell share a power supply wiring and a ground wiring, and further, the same kind of well layers arranged adjacently in an X direction. In this case, an unexpected current path is generated, and a large amount of leakage current flows through the unexpected current path. As a result, the voltages of the power supply wiring and the ground wiring are temporarily fluctuated. Thus, the operational margin of the memory cell connected to the power supply wiring and the ground wiring is greatly influenced by the above-described fluctuation of the voltage. Additionally, in the conventional SRAM, the leakage current slightly flows even through a transistor of the dummy memory cell having the correct shape.

In recent years, a power supply voltage is reduced as the pattern of an LSI has become finer, so that an operation current, i.e., a dynamic current is reduced to achieve low power consumption. However, a leakage current on standby, i.e., a static current is not decreased more than that of the operation current. Thus, a ratio of the leakage current in the current consumption increases. When the voltage is more decreased and the gate length is more shortened, the decrease in leakage current has come to an end at a certain stage, and thereafter, the leakage current is increased in turn. This becomes prominent in a 90-nm generation and the subsequent generations, and various countermeasures are proposed to reduce the leakage current. For example, a system is configured such that a power supply voltage becomes zero on the standby. Similarly, the ratio of the leakage current in the current consumption is increased due to the miniaturization in the dummy memory cell with correct shapes or with few incorrect shapes. Furthermore, as the number of dummy memory cells increases, the total leakage current becomes more. As a consequence, the leakage current flowing in the dummy memory cells increases a total leakage current in the SRAM, to increase the power consumption.

The dummy memory cell does not have a mechanism for writing or reading data. Therefore, a test of the dummy memory cell is not carried out or cannot be carried out. However, it was found by the inventor of the present invention that such an influence of the leakage current in the dummy memory cells to a memory cell array could not be ignored in the SRAM in a 0.15-µm generation. The leakage current in the dummy memory cell causes an erroneous operation of the SRAM and the defective quality due to increase in current consumption or power consumption. In future, as the pattern of the LSI becomes finer, there would be a possibility of degradation of quality due to the leakage current generated in the dummy memory cell, that is, an unexpected leakage current due to an incorrect shape or a leakage current associated with the fineness of a circuit configuration, if the conventional configuration is kept.

SUMMARY OF THE INVENTION

In aspect of the present invention, a static semiconductor memory device includes a memory cell formed in a memory cell region; and a dummy memory cell formed in a dummy memory cell region. The memory cell includes a power supply wiring and a ground wiring which are provided to extend in a direction of a word line; and inverters provided between the power supply wiring and the ground wiring and cross-connected to each other. The dummy memory cell includes first and second wirings respectively corresponding to the power supply wiring and the ground wiring and extending in the direction of the word line; and two sets of a dummy load circuit and a dummy drive transistor, wherein the two sets are connected with the first and second wirings, which are biased to prevent leakage current from flowing.

Here, each of the dummy cell and the memory cell includes a device section; and a wiring section provided above the device section. The wiring section of the memory cell includes the power supply wiring and the ground wiring, and the wiring section of the dummy memory cell comprises the first and second wirings, and the device section of the memory cell and the device section of the dummy memory cell have a same layout.

Also, the first and second wiring may be biased to a same voltage, or may be biased to different voltages.

Also, the dummy drive transistor may have a drain connected with one end of the dummy load circuit. The other end of the dummy load circuit may be connected with the first wiring and a source of the dummy drive transistor is connected with the second wiring. In this case, the dummy load circuit may include a dummy load resistor.

Also, the dummy load circuit may include a dummy load transistor. In this case, the dummy load transistor and the dummy drive transistor may be of a same conductive type, or may be of different conductive types.

Also, one end of the dummy load circuit is connected with a drain of the dummy driver transistor, and the other end of the dummy load circuit and the source of the dummy drive transistor are connected with the first wiring and the second wiring, respectively.

Also, the second wiring may be connected to the ground wiring of the memory cell, and the first wiring may be separated from the power supply wiring of the memory cell. In this case, the dummy memory cell may include a third wiring extending in a direction perpendicular to the direction of the word line, and the first and second wirings of the dummy memory cell are connected with the third wiring.

Also, a column of the dummy memory cells may be arranged in adjacent to a column of the memory cells through a column of Tap regions. Each of the Tap regions stabilizes a power supply voltage and a ground voltage supplied to the memory cells through the power supply wiring and the ground wiring, respectively.

Also, a column of the dummy memory cells, a column of Tap regions and a column of the memory cells may be arranged in this order. Each of the Tap regions stabilizes a power supply voltage and a ground voltage supplied to the memory cells through the power supply wiring and the ground wiring, respectively. In this case, a transistor connected with the power supply wiring is formed in an N well in the memory cell, and the Tap region adjacent to the memory cell has a P well, and is biased to the ground voltage.

In another aspect of the present invention, a static semiconductor memory device includes a memory cell formed in a memory cell region; and a dummy memory cell formed in a dummy memory cell region. The memory cell includes a power supply wiring and a ground wiring to supply a power supply voltage and a ground voltage, respectively; and inverters connected between the power supply wiring and the ground wiring and cross-connected to each other. The dummy memory cell includes first and second wirings provided in correspondence to the power supply wiring and the ground wiring, respectively; and two sets of a dummy load circuit and a dummy drive transistor, wherein the two sets are connected with the first and second wirings, and inputs and outputs of the two sets are cross-connected to each other.

Here, the dummy load circuit may be a p-type dummy load transistor, and the dummy drive transistor is an n-type MOS transistor. Sources of the dummy load transistor and the dummy drive transistor are respectively connected to the first and second wirings, which are connected with the ground voltage.

Also, the dummy load circuit may be an n-type dummy load transistor, and the dummy drive transistor is an n-type MOS transistor. Sources of the dummy load transistor and the dummy drive transistor are respectively connected to the first and second wirings, which are connected with the ground voltage.

Also, the dummy load circuit may be a p-type dummy load transistor, and the dummy drive transistor is an n-type MOS transistor. Sources of the dummy load transistor and the dummy drive transistor are respectively connected to the first and second wirings, which are respectively connected with the power supply voltage and the ground voltage. A set of the input of one set and the output of the other set is connected to the ground voltage, and a set of the input of the other set and the output of the one set is connected to the power supply voltage.

BRIEF DESCRIPTION OF THE DRAWINGS

FIG. 1 is a circuit diagram showing a memory cell according to the present invention;

FIG. 3 is a circuit diagram showing a dummy memory cell arranged in a direction of the bit line in a first embodiment according to the present invention;

FIGS. 5A and 5B are diagrams showing layouts of the dummy memory cell arranged in the direction of the bit line in the first embodiment according to the present invention;

FIGS. 7A and 7B are diagrams showing layouts of a Tap cell 300 according to the present invention;

FIGS. 8A and 8B are diagrams showing layouts of a Tap cell 301 according to the present invention;

FIGS. 9A and 9B are diagrams showing layouts of a Tap cell 302 according to the present invention;

FIGS. 11A and 11B are diagrams showing layouts of the cells in the SRAM in the second embodiment according to the present invention;

FIGS. 21A and 21B are diagrams showing the layouts of the cells in the SRAM in the first embodiment according to the present invention;

FIG. 22 is a circuit diagram showing the dummy memory cell arranged in the direction of the word line in the SRAM in the fourth embodiment according to the present invention;

FIGS. 23A and 23B are diagrams showing layouts of the dummy memory cell arranged in the direction of the word line in the SRAM in the fourth embodiment according to the present invention;

FIGS. 25A and 25B are diagrams showing the layouts of the cells in the SRAM in the fourth embodiment according to the present invention.

DESCRIPTION OF THE PREFERRED EMBODIMENTS

Hereinafter, a static semiconductor memory device such as a static random access memory device (SRAM) according to the present invention will be described in detail with reference to the attached drawings.

Figure 2A:
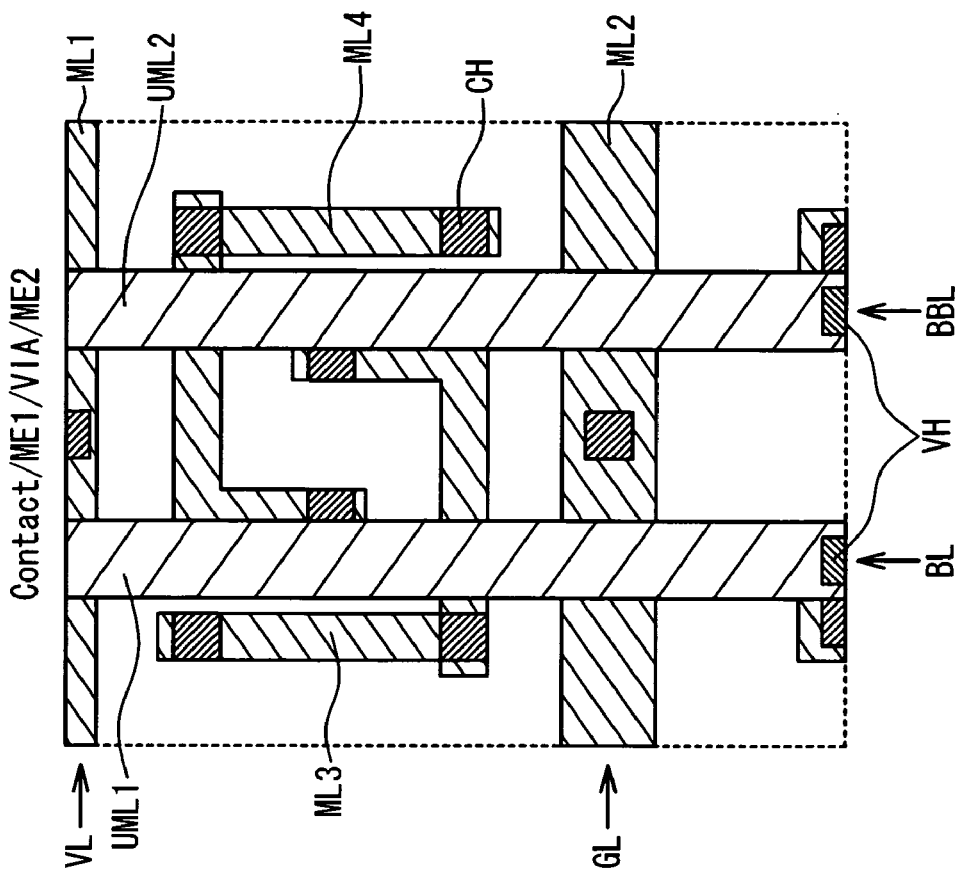
FIGS. 2A and 2B are diagrams showing layouts of the memory cell according to the present invention.
Figure 2B:
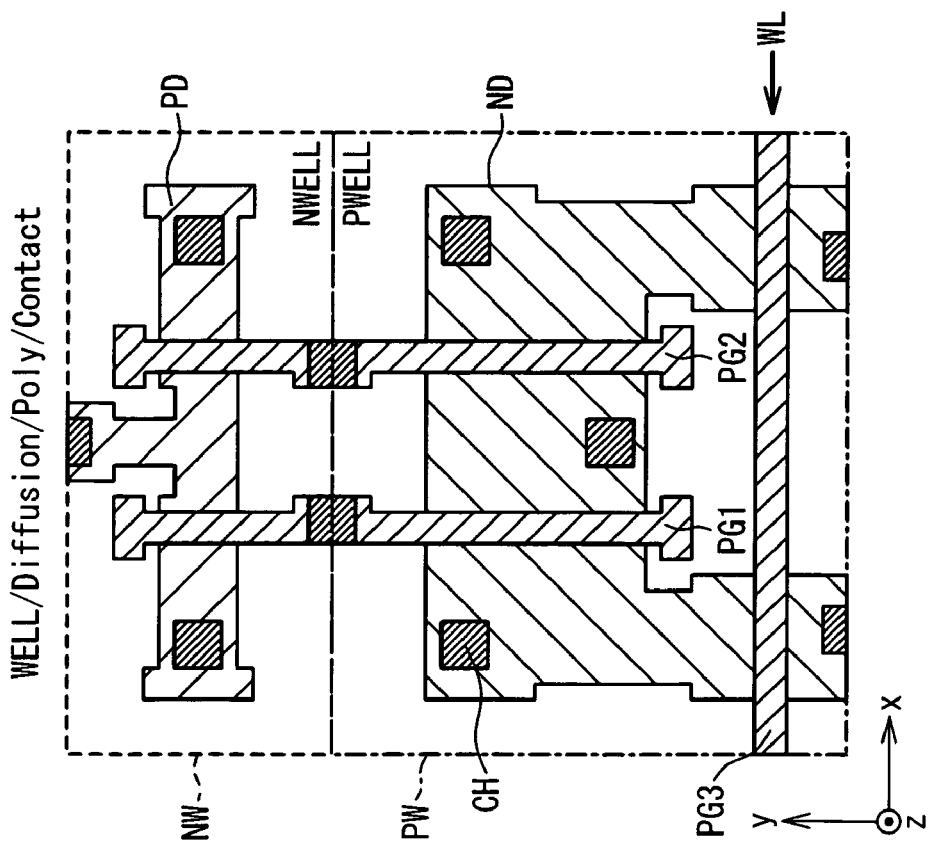

Referring to FIGS. 1, 2A and 2B, a memory cell in the SRAM according to the present invention will be described. FIG. 1 is a circuit diagram showing a memory cell 100 used in the SRAM according to the present invention. The memory cell 100 is provided with inverters 10A and 10B whose input and output terminals are cross-connected to each other, to form a flip-flop or latch circuit. The flip-flop is connected to a bit line BL and a bit B line BBL via access transistors 13A or 13B whose gates are connected with a word line WL, respectively. A WORD signal is supplied onto the word line WL, and a BIT signal and a BITB signal are transferred on the bit line BL and the bit B line BBL, respectively. In one example, a load transistor 11A of the inverter 10A is a P-type MOS transistor, and a drive transistor 12A thereof is an N-type MOS transistor. In the same manner, a load transistor 11B of the inverter 10B is a P-type MOS transistor, and a drive transistor 12B thereof is an N-type MOS transistor. Also, a source of each of the load transistors 11A and 11B is connected to the power supply voltage VDD, and further, a source of each of the drive transistors 12A and 12B is grounded.

FIGS. 2A and 2B are diagrams showing an example of layout of the memory cell 100 having the circuit shown in FIG. 1. FIG. 2A is a diagram showing a layout of a lower layer as a device section of the memory cell having a well region WELL, a diffusion layer Diffusion, a polysilicon layer Poly and a contact layer Contact. FIG. 2B is a diagram showing a layout of an upper wiring layer as a wiring section of the memory cell having a contact layer Contact, a first metal wiring layer ME1, a via-contact VIA and a second metal wiring layer ME2.

Referring to FIG. 2A, the device section in the memory cell 100 is provided with a well region WELL having an N-type well NW and a P-type well PW formed adjacently to the N-type well NW, and the diffusion region Diffusion having a P-type diffusion layer PD in the N-type well NW and an N-type diffusion region ND in the P-type well PW. Moreover, two polysilicon gates PG1 and PG2 are provided to extend in a Y direction across the P-type diffusion layer PD and the N-type diffusion layer ND. In addition, a polysilicon gate PG3 serving as the word line WL extends in the X direction across the P-type well PW. The P-type diffusion layer PD and the polysilicon gates PG (PG1, PG2) form P-type MOS transistors. Specifically, the P-type diffusion layer PD and a polysilicon gate PG1 form the load transistor 11A, and the P-type diffusion layer PD and a polysilicon gate PG2 form the load transistor 11B. The N-type diffusion layer ND and the polysilicon gates PG (PG1, PG2, PG3) form the N-type MOS transistors. Specifically, the N-type diffusion layer ND and the polysilicon gate PG3 form the access transistors 13A and 13B. Also, the N-type diffusion layer ND and the polysilicon gates PG1 and PG2 form the drive transistor 12A and the drive transistor 12B. A node of each of the gate, source and drain is connected to the metal wiring layer ML in the wiring section via a via-contact CH.

Referring to FIG. 2B, the wiring section includes the first metal wiring layer ME1 provided with the metal wirings ML (ML1, ML2, ML3, ML4) connected to the device section through the via-contacts CH, the via-contact layer VIA provided with via-contacts VH for connecting the first metal wiring. layer ME1 and the second metal wiring layer ME2, and the second metal wiring layer ME2 provided with upper metal wirings UML (UML1, UML2) to be used as the bit line BL or the bit line BBL. A metal wiring ML1 extends in the X direction in such a manner as to reach both ends of the memory cell, and functions as the power supply wiring VL to be connected to the power supply voltage $V_{DD}$. In addition, the metal wiring ML1 is connected to the sources of the load transistors 11A and 11B through the via-contact CH. In contrast, a metal wiring ML2 extends in the X direction in such a manner as to reach both ends of the memory cell, and is grounded, thereby forming the ground wiring GL as a substrate voltage GND. In addition, the metal wiring ML2 is connected to the sources of the drive transistors 12A and 12B through the via-contact CH. A metal wiring ML3 is connected to a drain of the load transistor 11A, a drain of the drive transistor 12A and a drain of the access transistor 13A and a gate of each of the load transistor 11B and the drive transistor 12B via the via-contacts CH. Moreover, a metal wiring ML4 is connected to a drain of each of the load transistor 11B, the drive transistor 12B and the access transistor 13B and a gate of each of the load transistor 11A and the drive transistor 12A through the via-contacts CH. Sources of the access transistors 13A and 13B are connected to the bit line BL, i.e., the upper metal wiring UML1, and the bit B line BBL, i.e., the upper metal wiring UML2, through the via-contacts CH, metal wirings and the via-contacts VH, respectively.

Next, the dummy memory cell will be described below. In this description, the same reference symbols and numerals are allocated to the same components corresponding to those of the memory cell 100. For example, a metal wiring ML1-1 in a dummy memory cell 200 corresponds to the metal wiring ML1 in the memory cell 100.

First Embodiment

The SRAM according to the first embodiment of the present invention will be described with reference to FIGS. 3 to 11. In the SRAM in the first embodiment, dummy memory cells 201, 211 and 221 are used, in which the same P-type MOS transistor as the load transistor 11 in the memory cell 100 is used as a dummy load transistor.

FIG. 3 is a circuit diagram showing one of dummy memory cells 201 arranged in a direction of the bit lines in the SRAM according to the first embodiment of the present invention. The dummy memory cell 201 in the first embodiment is provided with dummy inverters 20-1 (20A-1 and 20B-1) corresponding to inverters 10 (10A and 10B) in the memory cell and dummy access transistors 23 (23A-1 and 23B-1) corresponding to the access transistors 13 (13A and 13B). Input and output terminals of the dummy inverters 20A-1 and 20B-1 are cross-connected to each other, and connected with the dummy access transistors 23A-1 and 23B-1. A source of the dummy access transistor 23A-1 (or 23B-1) is separated from a dummy bit line DBL (or the dummy bit B line DBBL), and a gate thereof is connected with a word line WL. A WORD signal is supplied onto the word line WL. The dummy inverter 20A-1 or 20B-1 includes a P-type MOS transistor 21A-1 or 21B-1 as a dummy load transistor and an N-type MOS transistor 22A-1 or 22B-1 as a dummy drive transistor. A source of each of the dummy load transistor 21A-1 or 21B-1 and the dummy drive transistor 22A-1 or 22B-1 is grounded.

Figure 4:
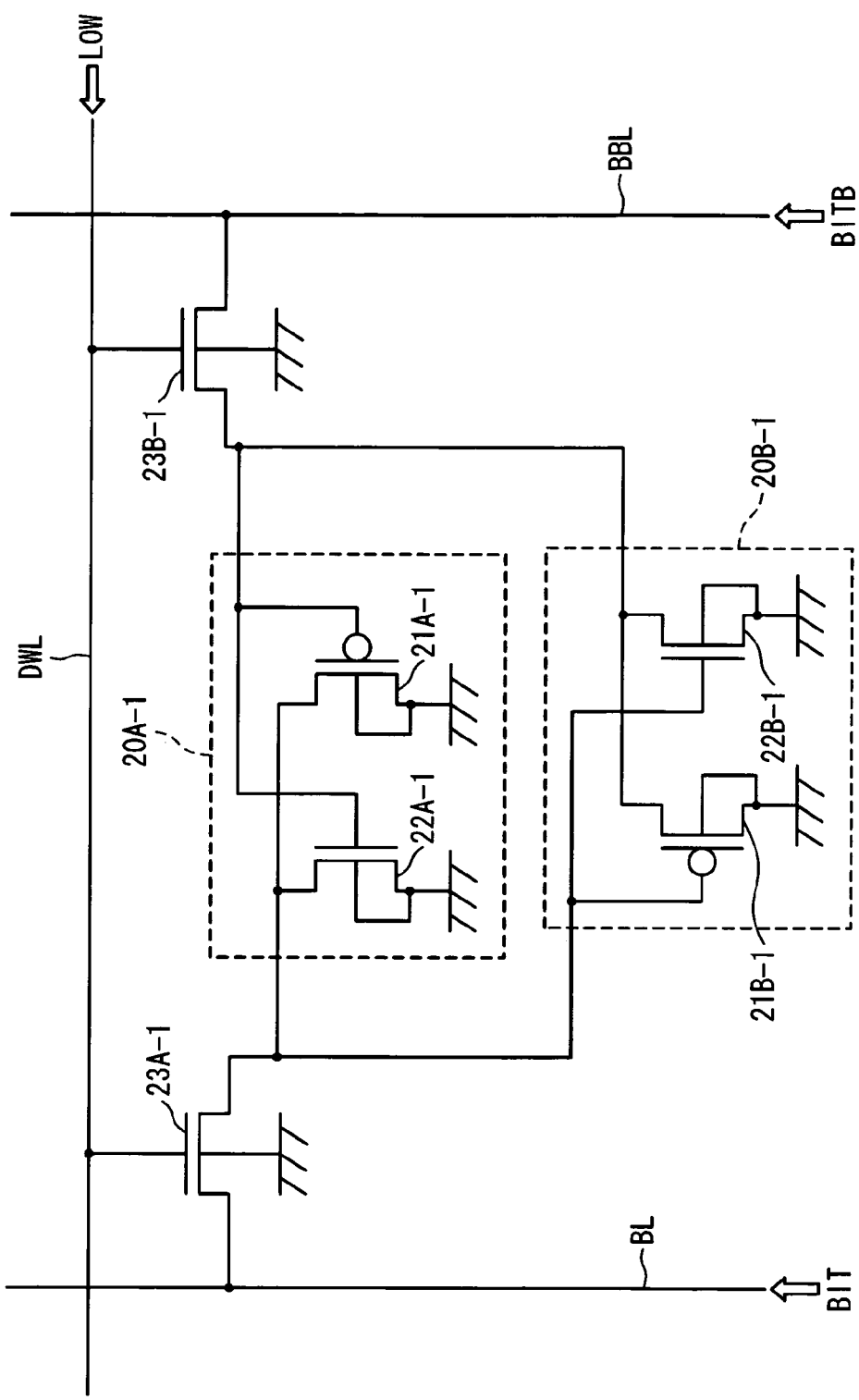
FIG. 4 is a circuit diagram showing a dummy memory cell arranged in a direction of a word line in the first embodiment and a second embodiment according to the present invention.

FIG. 4 is a circuit diagram showing one of dummy memory cells 211 arranged in a direction of the word line WL in the SRAM in the first embodiment. The dummy memory cell 211 is provided with a dummy word line DWL, the bit line BL and the bit B line BBL in place of the word line, the dummy bit line DBL and the dummy bit B line DBBL in the configuration of the dummy memory cell 201, respectively. A bit signal BIT and a bit B signal BITB are transferred onto the bit line BL and the bit B line BBL, respectively. The dummy inverters 20A-1 and 20B-1 are cross-connected to each other, in the same way as the dummy memory cell 201. Also, the dummy inverters 20A-1 and 20B-1 are connected with the dummy bit line DBL and the dummy bit B line DBBL through the dummy access transistors 23A-1 and 23B-1, respectively. A gate of each of the dummy access transistors 23A-1 and 23B-1 is connected with the dummy word line DWL. A signal of a Low level is supplied to the dummy word line DWL, so that the access transistors 23A-1 and 23B-1 are always turned off. In addition, a source of the dummy access transistor 23A-1 (or 23B-1) is connected to the bit line BL (or the bit B line BBL).

FIGS. 5A and 5B are diagrams showing layouts of the dummy memory cell 201. FIG. 5A shows a layout of a device section and FIG. 5B shows a layout of a wiring section arranged above the device section shown in FIG. 5A. The layout of the device section in the dummy memory cell 201 is same as that of the device section in the memory cell 100. Referring to FIG. 5A, the dummy memory cell 201 is provided with the well region WELL having the N-type well NW and the P-type well PW arranged adjacently to the N-type well NW, and the diffusion layer Diffusion having the P-type diffusion layer PD in the N-type well NW and the N-type diffusion layer ND in the P-type well PW. Also, two polysilicon gates PG1 and PG2 are arranged to extend in the Y direction across the P-type diffusion layer PD and the N-type diffusion layer ND. In addition, the polysilicon gate PG3 serving as the dummy word line DWL extends in the X direction across the P-type well PW and the N-type diffusion layer ND in such a manner as to reach both ends of one side in the dummy memory cell 201.

The P-type diffusion layer PD and the polysilicon gate PG1 form a dummy load transistor 21A-1 and the P-type diffusion layer PD and the polysilicon gate PG2 form a dummy load transistor 21B-1. The N-type diffusion layer ND and the polysilicon gate PG1 form a dummy drive transistor 22A-1, and the N-type diffusion layer ND and the polysilicon gate PG2 form a dummy drive transistor 22B-1. The N-type diffusion layer ND and the polysilicon gate PG3 form dummy access transistors 23A-1 and 23B-1. Nodes of the gate, source and drain of these transistors are connected to the metal wirings ML (ML1-1, ML2-1, ML3 and ML4) in the wiring section through via-contacts CH.

Referring to FIG. 5B, the metal wiring ML1-1 is designed in such a manner as not to reach both ends of a dummy memory cell 201 in the X direction. Thus, a metal wiring ML1-1 is prevented from being connected to the power supply wiring VL in a Tap cell or the memory cell 100 adjacent in the direction of the word line, i.e., in the X direction. A metal wiring ML2-1 extends in the X direction in such a manner as to reach both ends of the dummy memory cell, and is grounded, thereby forming a ground wiring GL2 of the substrate voltage GND. Furthermore, the metal wiring ML2-1 is connected to the sources of the dummy drive transistors 22A-1 and 22B-1 through the via-contact CH. The metal wiring ML3 is connected to the drain of each of the dummy load transistor 21A-1, the dummy drive transistor 22A-1 and the dummy access transistor 23A-1 and the gate of each of the dummy load transistor 21B-1 and the dummy drive transistor 22B-1 through the via-contacts CH. Additionally, the metal wiring ML4 is connected to a drain of each of the dummy load transistor 21B-1, the dummy drive transistor 22B-1 and the dummy access transistor 23B-1 and the gate of each of the dummy load transistor 21A-1 and the dummy drive transistor 22A-1 through the via-contacts CH. A via-contact VH2 is adapted to connect the ground wiring GL1 (ML2-1) of the first wiring layer ME1 and the ground wiring GL2 (UML2-1) of the second wiring layer ME2, i.e., an upper metal wiring UML2-1. The second wiring layer ME2 includes the dummy bit line DBL, i.e., the upper metal wiring UML1-1 extending in the Y direction and the ground wiring GL2 serving as the substrate ground GND. The ground wiring GL2, i.e., an upper metal wiring UML2-1 is connected to the metal wiring ML1-1 through the via-contact VH1. As a consequence, the metal wiring ML1-1 serving as a ground wiring GL3 is adapted to allow sources of the dummy load transistors 21A-1 and 21B-1 to be grounded, i.e., to be connected to the substrate ground GND through the via-contact CH. Moreover, the ground wiring GL1 allows sources of the dummy drive transistors 22A-1 and 22B-1 to be grounded, i.e., to be connected to the substrate ground GND through the via-contact CH.

Figure 6B:
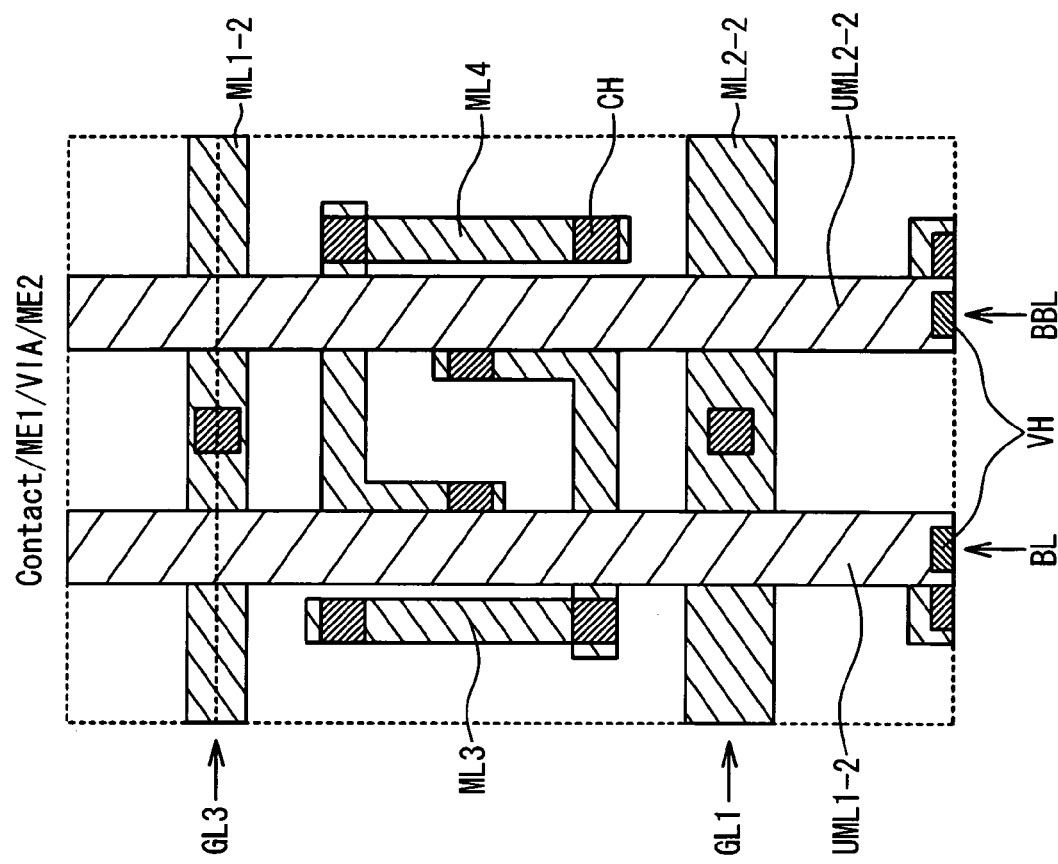
FIGS. 6A and 6B are diagrams showing layouts of the dummy memory cell arranged in the direction of the word line in the first and second embodiments according to the present invention.
Figure 6A:
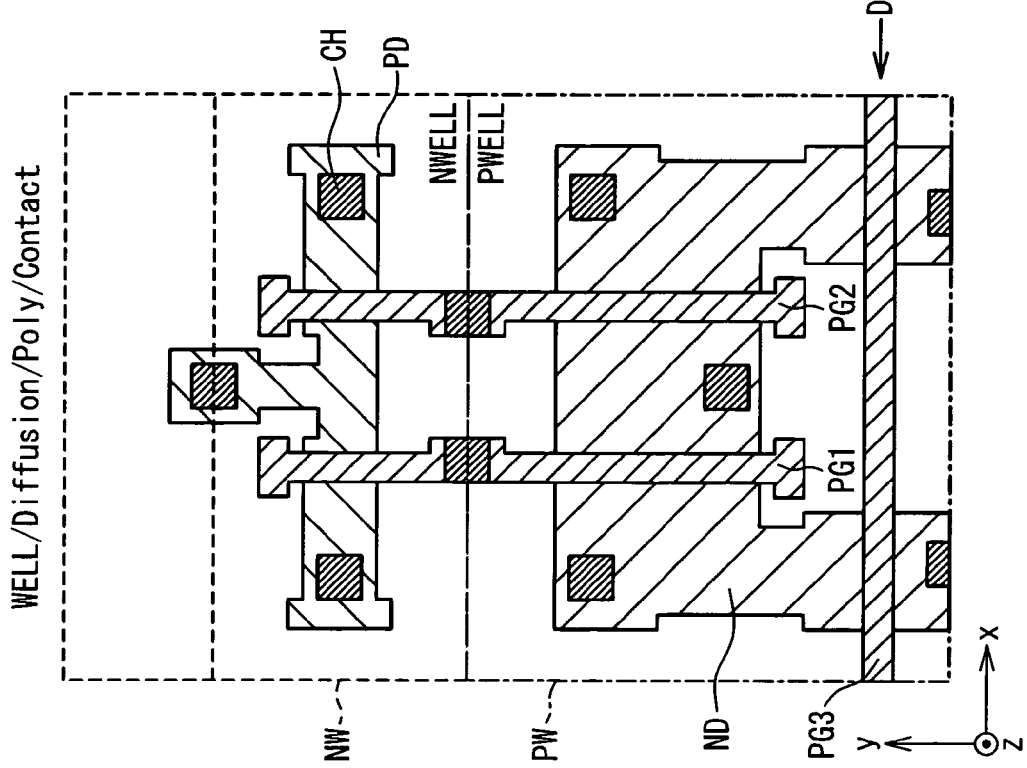

FIGS. 6A and 6B are diagrams showing layouts of the dummy memory cell 211. FIG. 6A shows the layout of the device section and FIG. 6B shows the layout of the wiring section arranged above the device section. Referring to FIG. 6A, the layout of the device section in the dummy memory cell 211 is same as or similar to that of the device section in the dummy memory cell 201 except that a signal in the Low level is supplied to the polysilicon PG3 serving as the dummy word line DWL. Referring to FIG. 6B, the metal wiring ML1-2 (GL3) extends in the X direction in such a manner as to reach both ends of the dummy memory cell 211, and is grounded, thereby forming the ground wiring GL3 of the substrate voltage GND. Furthermore, the metal wiring ML1-2 is connected to the sources of the dummy load transistors 21A-1 and 21B-1 through the via-contact CH. The metal wiring ML2-2 (GL1) extends in the X direction in such a manner as to reach both ends of the memory cell, and is grounded, thereby forming the ground wiring GL1 of the substrate voltage GND. Furthermore, the metal wiring ML2-2 is connected to the sources of the dummy drive transistors 22A-1 and 22B-1 through the via-contact CH. The metal wiring ML3 is connected to the drain of each of the dummy load transistor 21A-1, the dummy drive transistor 22A-1 and the dummy access transistor 23A-1 and the gate of each of the dummy load transistor 21B-1 and the dummy drive transistor 22B-1 through the via-contacts CH. Additionally, the metal wiring ML4 is connected to the drain of each of the dummy load transistor 21B-1, the dummy drive transistor 22B-1 and the dummy access transistor 23B-1 and the gate of each of the dummy load transistor 21A-1 and the dummy drive transistor 22A-1 through the via-contacts CH. Sources of the dummy access transistors 23A-1 and 23B-1 are connected to the bit line BL, i.e., an upper metal wiring UML1-2, and the bit B line BBL, i.e., an upper metal wiring UML2-2, through the via-contacts CH, the metal wiring ML and the via-contacts VH, respectively.

In order to stabilize the power supply voltage VDD or the substrate voltage GND in the memory cell 100 in a memory cell array, Tap regions are typically arranged in the direction of bit line or in the Y direction, for every several memory cell columns. FIGS. 7A and 7B are diagrams showing layouts of a Tap cell 300. FIG. 7A is a diagram showing the layout of the device section of a well layer WELL, a diffusion layer Diffusion, a polysilicon layer Poly and a contact layer Contact. FIG. 7B is a diagram showing the layout of the wiring section of the contact layer Contact and the first metal wiring layer ME1 in the device section.

Referring to FIG. 7A, the device section in the Tap cell 300 is provided with the well layer WELL having the N-type well NW and the P-type well PW arranged adjacently to the N-type well NW, and the diffusion layer Diffusion having the N-type diffusion layer ND in the N-type well NW and the P-type diffusion layer PD in the P-type well PW. Furthermore, a polysilicon gate PG extends in the X direction across the P-type well PW serving as the word line WL or dummy word line DWL above the P-type well PW in such a manner as to reach both ends of the Tap cell 300. In addition, the N-type diffusion layer ND, the P-type diffusion layer PD and the polysilicon gate PG are connected to the metal wirings ML (ML5, ML6 and ML7) of the first metal wiring layer ME1 through the via-contacts CH.

Referring to FIG. 7B, the metal wiring ML5 (WL or DWL) of the first metal wiring layer ME1 extends in the X direction in such a manner as to reach both ends of the Tap cell 300, and is connected to the power supply wiring VL or the ground wiring GL. Furthermore, the metal wiring ML5 is connected to the N-type diffusion layer ND through the via-contacts CH. The metal wiring ML6 extends in the X direction in such a manner as to reach both ends of the Tap cell 300, and is connected to the ground wiring GL. Furthermore, the metal wiring ML6 is connected to the P-type diffusion layer PD through the via-contacts CH. The metal wiring ML7 is arranged in separation from both ends of the Tap cell 300, and is connected to the polysilicon gate PG serving as the word line WL or the dummy word line DWL through the via-contacts CH.

FIGS. 8A and 8B are diagrams showing layouts of a Tap cell 301 arranged between the dummy memory cells 211. FIG. 8A is a diagram showing the layout of the device section of a well layer WELL, a diffusion layer Diffusion, the polysilicon layer Poly and the contact layer Contact. FIG. 8B is a diagram showing the layout of the wiring section of the contact layer Contact and the first metal wiring layer ME1 in the device section.

Referring to FIG. 8A, the Tap cell 301 is provided with the well layer WELL having the N-type well NW and the P-type well PW arranged adjacently to the N-type well NW, and the diffusion layer Diffusion having the N-type diffusion layer ND in the N-type well NW and the P-type diffusion layer PD in the P-type well PW. Furthermore, the polysilicon gate PG extends in the X direction across the P-type well PW serving as the dummy word line DWL above the P-type well PW in such a manner as to reach both ends of the Tap cell 301. In addition, the N-type diffusion layer ND, the P-type diffusion layer PD and the polysilicon gate PG are connected to the metal wiring ML (ML8, ML9, ML10) of the first metal wiring layer ME1 through the via-contacts CH.

Referring to FIG. 8B, the metal wiring ML8 of the first metal wiring layer ME1 extends in the X direction in such a manner as to reach both ends of the Tap cell 301, and is connected to the ground wiring GL3. Furthermore, the metal wiring ML8 is connected to the N-type diffusion layer ND through the via-contacts CH. The metal wiring ML9 extends in the X direction in such a manner as to reach both ends of the Tap cell 301, and is connected to the ground wiring GL1. Furthermore, the metal wiring ML9 is connected to the P-type diffusion layer PD through the via-contacts CH. Here, the metal wiring ML8 and the metal wiring ML9 are connected to each other. The metal wiring ML10 is arranged in separation from both ends of the Tap cell 301, and is connected to the polysilicon gate PG serving as the word line WL through the via-contacts CH.

FIGS. 9A and 9B are diagrams showing layouts of a Tap cell 302 arranged in the Y direction or in the direction of the bit line between the memory cell 100 and the dummy memory cell 201. FIG. 9A is a diagram showing the layout of the device section, and FIG. 9B is a diagram showing the layout of the wiring section arranged above the device section of FIG. 9A.

Referring to FIG. 9A, the Tap cell 302 is provided with a well layer WELL having the N-type well NW and the P-type well PW arranged adjacently to the N-type well NW, and a diffusion layer Diffusion having the N-type diffusion layer ND in the N-type well NW and the P-type diffusion layer PD in the P-type well PW. The well layer adjacent to the dummy memory cell in the X direction is constituted of the P-type well PW. Furthermore, the polysilicon gate PG extends in the X direction across the P-type well PW serving as the word line WL above the P-type well PW in such a manner as to reach both ends of the Tap cell 302. In addition, the N-type diffusion layer ND, the P-type diffusion layer PD and the polysilicon gate PG are connected to the metal wirings ML (ML11, ML12 and ML13) of the first metal wiring layer ME1 through the via-contacts CH.

Referring to FIG. 9B, the metal wiring ML11 of the first metal wiring layer ME1 extends in the X direction in such a manner as to reach both ends of the Tap cell 302, and is connected to the power supply wiring VL. Furthermore, the metal wiring ML11 is connected to the N-type diffusion layer ND through the via-contacts CH. The metal wiring ML12 extends in the X direction in such a manner as to reach both ends of the Tap cell 301, and is connected to the ground wiring GL1. Also, the metal wiring ML12 is connected to the P-type diffusion layer PD through the via-contacts CH. The metal wiring ML13 is arranged in separation from both ends of the Tap cell 301, and is connected to the polysilicon gate PG serving as the word line WL through the via-contacts CH.

With the above-described configurations, the Tap regions can stabilize the voltages to be supplied to the wells in the memory cell 100.

Figure 10:
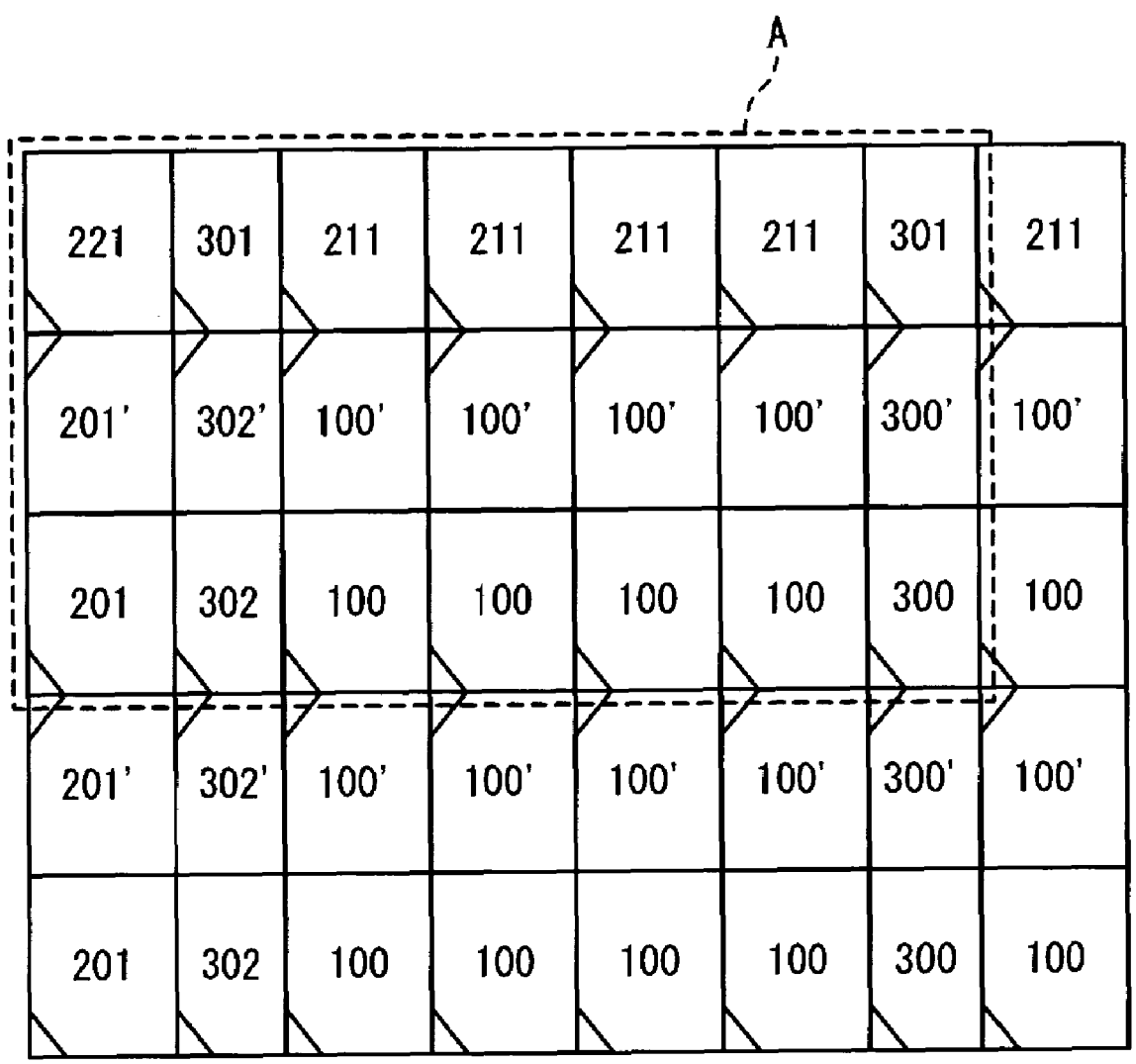
FIG. 10 is a diagram showing a layout of the cells in the SRAM in the first embodiment according to the present invention.

FIG. 10 is a diagram showing a configuration of a corner portion of the SRAM including the memory cells 100, the dummy memory cells 201, 211 and 221, and the Tap cells 300, 301 and 302 in the first embodiment. The cells having a diagonal line at a left lower portion are forward cells, and the cells having a diagonal line at a left upper portion are reverse cells. The reverse cell is formed by reversing the forward cell with respect to the X direction. The reverse cell is indicated with a symbol ['].

In the SRAM, the forward cells and the reverse cells are alternately arranged adjacently to each other in the direction of the bit line, i.e., in the Y direction, and the same type of cells are arranged adjacently to each other in the direction of the word line, i.e., in the X direction. A dummy memory cell region is arranged around a region of a memory cell array. The dummy memory cells 201 are arranged in the Y direction in the dummy memory cell region, and in contrast, the dummy memory cells 211 are arranged in the X direction in the dummy memory cell region. The dummy memory cell 221, which is a modification of the dummy memory cell 201, is arranged at a corner of the dummy memory cell region. The dummy memory cells 201 and 211 are arranged in 1-dimensional line in the dummy memory cell region in this embodiment. However, the dummy memory cells 201 and 211 are preferably arranged in a plurality of lines. In this case, the proximity effect of the layout can be effectively attained.

Referring to FIG. 3, the circuit of the dummy memory cell 221 will be described. In the dummy memory cell 221, the dummy word line DWL is used in place of the word line WL in the configuration of the dummy memory cell 201. In addition, in the layout of the device section of the dummy memory cell 221, the polysilicon gate PG3 in the dummy memory cell 201 shown in FIG. 5A serves as the dummy word line DWL and the signal in the low level is supplied thereto. Moreover, in the wiring section of the dummy memory cell 221, the metal wiring ML1-1 in the dummy memory cell 201 extends to the metal wiring ML8 in the Tap cell 301 arranged adjacently in the direction of the word line, i.e., in the X direction.

A column of the Tap cells 302 is arranged between the column of the dummy memory cells 201 and the column of the memory cells 100, which are arranged in the Y direction. Also, a column of the Tap cells 300 is arranged in the memory cell array for every several columns of the memory cells 100. Additionally, the Tap cell 301 is arranged to be adjacent to the end of the column of the Tap cells 302 between the dummy memory cells 221 and 211 or the column of the Tap cells 300 between the dummy memory cells 221. In this embodiment, the dummy memory cells 221 and 211 and the Tap cells 301 are arranged in the X direction in the outermost region as the forward cells.

FIGS. 11A and 11B show layouts of a group of the cells surrounded by a dot line A in FIG. 10. FIG. 11A is a diagram showing the layout of the device section and FIG. 11B is a diagram showing the layout of the wiring section arranged above the device section.

Referring to FIG. 11B, the wiring sections in the column of the dummy memory cell 221, the dummy memory cells 201' and the dummy memory cells 201 arranged in the Y direction will be described. The upper metal wiring UML2-1 of the dummy memory cell 221, the upper metal wiring UML2-1 of the dummy memory cell 201' and the upper metal wiring UML2-1 of the dummy memory cell 201 are connected to the ground wiring GL2 of the substrate voltage GND.

Subsequently, the wiring sections in the row of the dummy memory cell 221, the Tap cell 301, the dummy memory cells 211, . . . and the Tap cell 301 arranged in the X direction will be described. The metal wiring ML1-1 of the dummy memory cell 221, the metal wiring ML8 of the Tap cell 301, the metal wiring ML1-2 of the dummy memory cell 211 and the metal wiring ML8 of the Tap cell 301 are connected to be grounded, thereby forming the ground wiring GL3 as the substrate voltage GND. Furthermore, the metal wiring ML2 of the dummy memory cell 221, the metal wiring ML9 of the Tap cell 301, the metal wiring ML2-2 of the dummy memory cell 211 are connected mutually to be grounded, thereby forming the ground wiring GL1 of the substrate voltage GND. In this manner, the sources of the dummy load transistors 21-1 (21A-1 and 21B-1) and the dummy drive transistors 22-1 (22A-1 and 22B-1) of the dummy memory cells 221 and 211 are grounded.

Next, the wiring sections in the row of the dummy memory cell 201', the Tap cell 302', the memory cell 100', . . . and the Tap cell 300' arranged in the X direction will be described. The metal wiring ML2-1 of the dummy memory cell 201', the metal wiring ML12 of the Tap cell 302', the metal wiring ML2 of the memory cell 100' and the metal wiring ML6 of the Tap cell 300 are connected one after another and are grounded, thereby forming the ground wiring GL1 of the substrate voltage GND. Moreover, the metal wiring ML1-1 of the dummy memory cell 201' and the metal wiring ML8 of the Tap cell 302' are separated while the metal wiring ML1-1 of the dummy memory cell 201' is grounded through the ground wiring GL2, thereby forming the ground wiring GL3 of the substrate voltage GND. In the meantime, the metal wiring ML11 of the Tap cell 302', the metal wiring ML1 of the memory cell 100' and the metal wiring ML5 of the Tap cell 300 are connected one after another and finally to the power supply $V_{DD}$, thereby forming a power supply wiring VL of the power supply voltage $V_{DD}$. In this way, the sources of the dummy load transistors 21-1 (21A-1 and 21B-1) of the dummy memory cell 201 and the dummy memory cell 201' are grounded in separation from the power supply voltage.

Next, referring to FIG. 11A, the device sections in the row of the dummy memory cell 201', the Tap cell 302', the memory cell 100', . . . and the Tap cell 300' arranged in the X direction will be described. The well layer WELL of the Tap cell 302' adjacent to the N-type well NW of the dummy memory cell 201' is the P-type well PW. Since the P-type well PW is interposed between the N-type well NW of the Tap cell 302' connected to the power supply wiring VL of the power supply voltage $V_{DD}$ and the N-type well NW connected to the ground wiring GL3 of the substrate voltage GND of the dummy memory cell 201' adjacent to the Tap cell 302', an NPN junction region is formed between the Tap cell 302' and the dummy memory cell 201', that is, between the power supply voltage $V_{DD}$ and the ground voltage GND. As a consequence, it is possible to prevent any unnecessary current from flowing to a device in the dummy memory cell 201' from the power supply wiring VL.

As described above, the sources of the dummy load transistors 21-1 of the dummy memory cells 201, 211 and 221 are separated from the power supply wiring VL, and are connected to the ground wiring GL. Therefore, no leakage current due to the power supply voltage $V_{DD}$ can be generated in the dummy memory cells 201, 211 and 221. Consequently, even when the dummy memory cells 201, 211 and 221 use the same P-type MOS transistors as those in the memory cell 100, namely, have the device sections of the same layout as or the similar layout to that of the memory cell 100, the SRAM can be produced with no leakage current. The use of the dummy memory cell having the same layout as or the similar layout to that of the memory cell 100 allows a more excellent proximity effect. Thus, the operation of the memory cell can be stabilized, so that the defect ratio of the SRAM can be reduced.

Second Embodiment

Next, the SRAM according to the second embodiment of the present invention will be described with reference to FIGS. 12A and 12B to 15A and 15B. When the P-type well PW region of the Tap cell 302 adjacent to the N-type well NW of the dummy memory cell 201 in the first embodiment can not be prepared due to miniaturization of the cell, the Tap cell 303 is used in the SRAM in the second embodiment in place of the Tap cell 302 in the SRAM in the first embodiment. In the Tap cell 303, the whole well layer WELL of the Tap cell is a P-type well PW. In addition, a dummy memory cell 202 is used in place of the dummy memory cell 201 in the first embodiment. The circuit configuration of the dummy memory cell 202 in the second embodiment is same as or similar to that of the dummy memory cell 201 shown in FIG. 3.

Figure 12B:
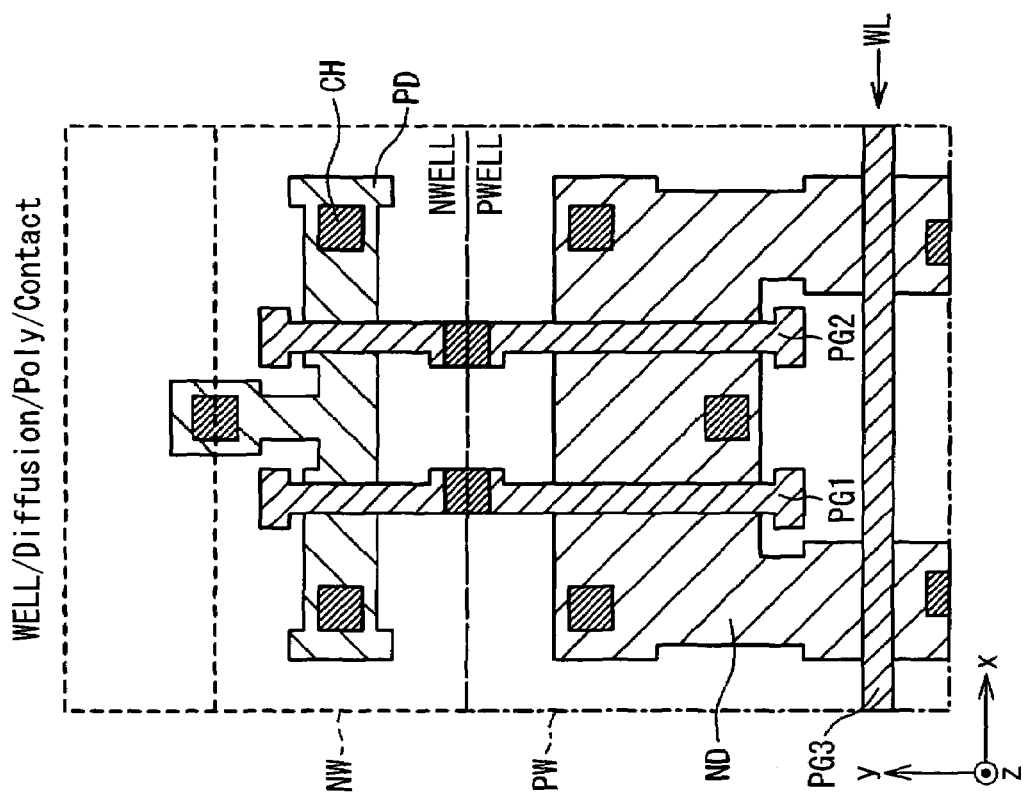
FIGS. 12A and 12B are diagrams showing layouts of the dummy memory cell arranged in the direction of the bit line in the second embodiment according to the present invention.
Figure 12A:
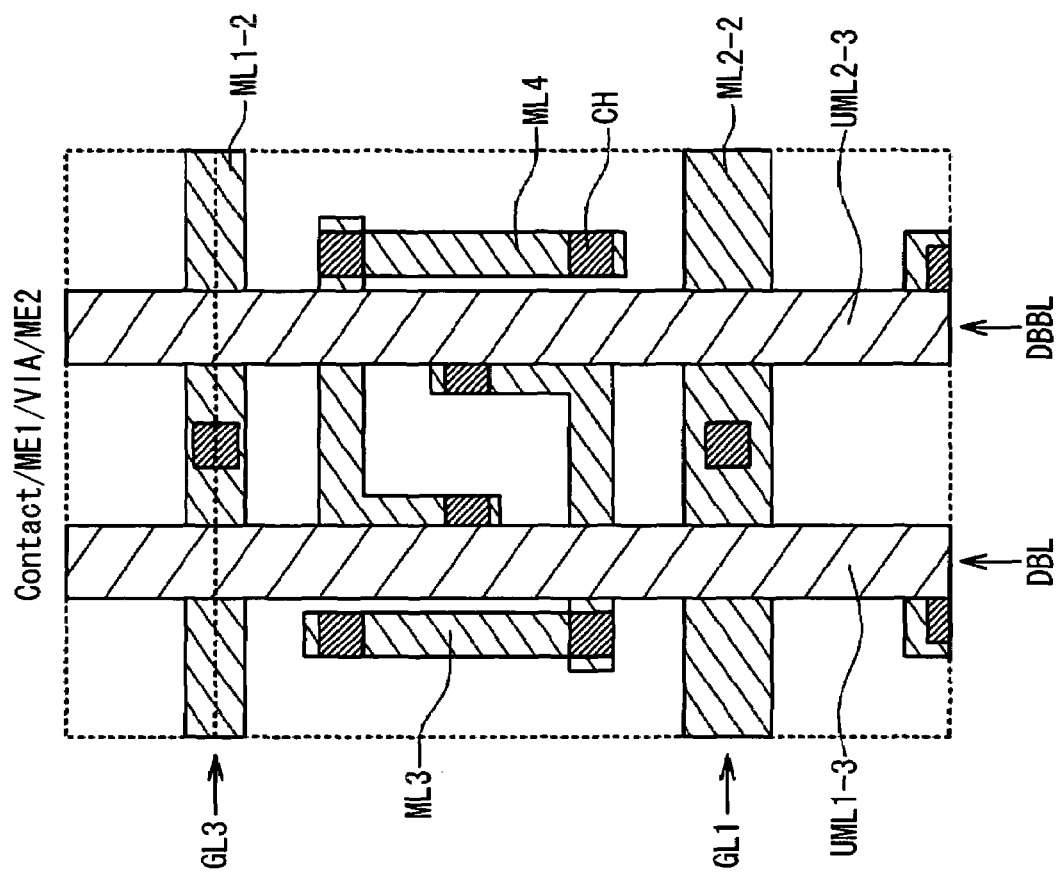

FIGS. 12A and 12B are diagrams showing layouts of the dummy memory cell 202. FIG. 12A shows the layout of the device section, and FIG. 12B shows the layout of the wiring section arranged above the device section. Referring to FIG. 12A, the layout of the device section in the dummy memory cell 202 is same as or similar to the layout of the device section in the dummy memory cell 201. Referring to FIG. 12B, the metal wiring ML1-2 of the dummy memory cell 202 extends in the X direction in such a manner as to reach both ends of the dummy memory cell 211, and is grounded, thereby forming the ground wiring GL3 of a substrate voltage GND. Furthermore, the metal wiring ML1-2 is connected to the sources of the dummy load transistors 21A-1 and 21B-1 through the via-contact CH. The metal wiring ML2-2 extends in the X direction in such a manner as to reach both ends of the memory cell, and is grounded, thereby forming the ground wiring GL1 of the substrate voltage GND. Furthermore, the metal wiring ML2-2 is connected to the sources of the dummy drive transistors 22A-2 and 22B-2 through the via-contact CH. The metal wiring ML3 is connected to the drain of each of the dummy load transistor 21A-1, the dummy drive transistor 22A-1 and the dummy access transistor 23A-1 and the gate of each of the dummy load transistor 21B-1 and the dummy drive transistor 22B-1 through the via-contacts CH. Additionally, the metal wiring ML4 is connected to the drain of each of the dummy load transistor 21B-1, the dummy drive transistor 22B-1 and the dummy access transistor 23B-1 and the gate of the dummy load transistor 21A-1 and the dummy drive transistor 22A-1 through via-contacts CH. The second wiring layer ME2 has the dummy bit line DBL, i.e., an upper metal wiring UML1-3, and the dummy bit B line DBBL, i.e., an upper metal wiring UML2-3, which extend in the Y direction.

Figure 13B:
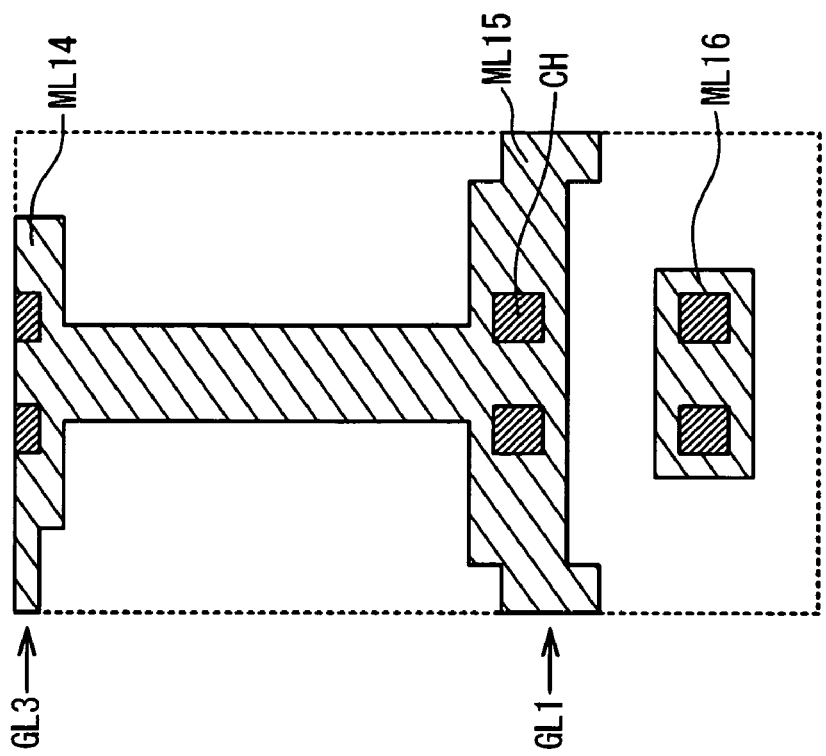
FIGS. 13A and 13B are diagrams showing layouts of a Tap cell 303 according to the present invention.
Figure 13A:
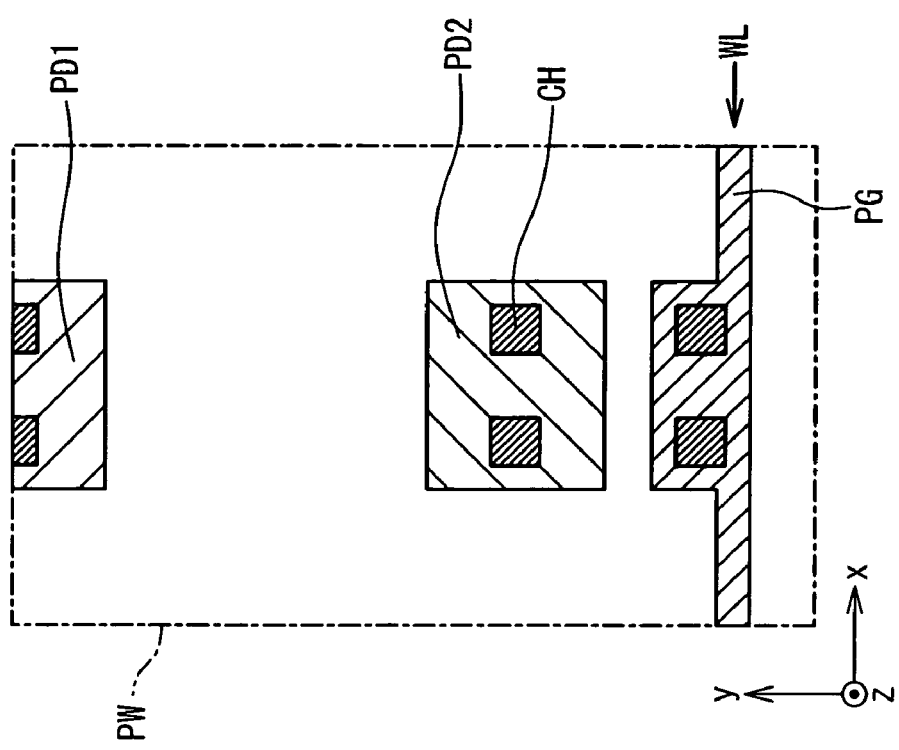

FIGS. 13A and 13B are diagrams showing the layouts of the Tap cell 303. FIG. 13A is a diagram showing the layout of the device section, and FIG. 13B is a diagram showing the layout of the wiring section arranged above the device section.

Referring to FIG. 13A, the device section in the Tap cell 303 is provided with the well layer WELL including a P-type well PW and a diffusion layer Diffusion having a P-type diffusion layers PD1 and PD2. Furthermore, a polysilicon gate PG extends in the X direction across the P-type well PW to function as the word line WL above the P-type well PW in such a manner as to reach both ends of the Tap cell 303. In addition, the P-type diffusion layers PD1 and PD2 and the polysilicon gate PG are connected to the metal wirings ML (ML14, ML15 and ML16) of the first metal wiring layer ME1 through the via-contacts CH.

Referring to FIG. 13B, the metal wiring ML14 of the first metal wiring layer ME1 extends in the X direction in such a manner as to be connected to the metal wiring ML1-2, i.e., the ground wiring GL3 of the dummy memory cell 202 adjacent to the Tap cell 303 while being separated from the power supply wiring VL of the adjacent memory cell 100, i.e., the metal wiring ML1. Furthermore, the metal wiring ML14 is connected to the P-type diffusion layer PD through the via-contacts CH. The metal wiring ML15 extends in the X direction in such a manner as to reach both ends of the Tap cell 303, and is connected to the ground wiring GL1. Furthermore, the metal wiring ML15 is connected to the P-type diffusion layer PD through the via-contacts CH. Here, the metal wiring ML14 and the metal wiring ML15 are connected to each other. The metal wiring ML16 is arranged in separation from both ends of the Tap cell 303, and is connected to the polysilicon gate PG serving as the word line WL through the via-contacts CH.

Figure 14:
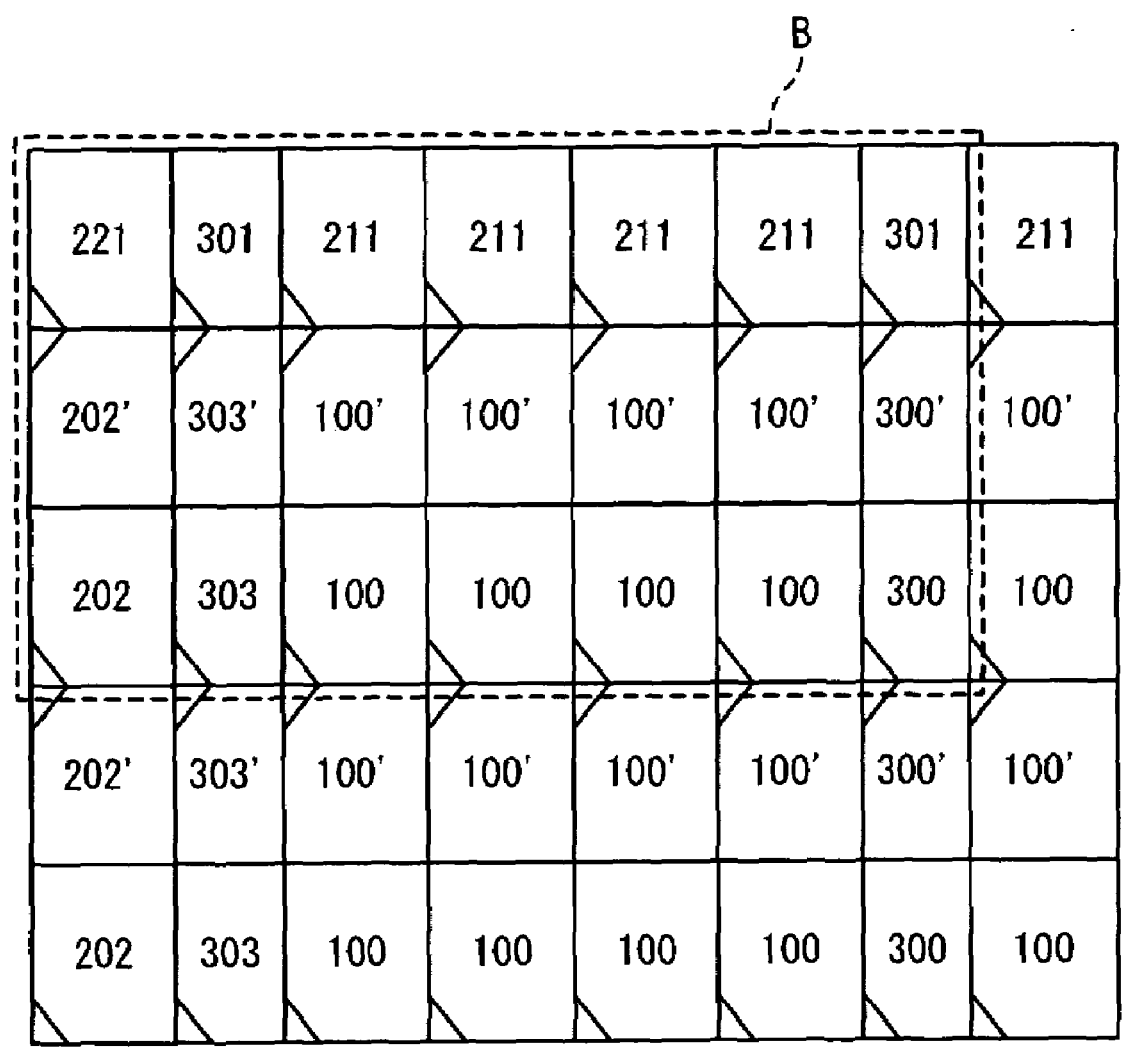
FIG. 14 is a diagram showing a layout of the cells in the SRAM in the second embodiment according to the present invention.
Figure 15:
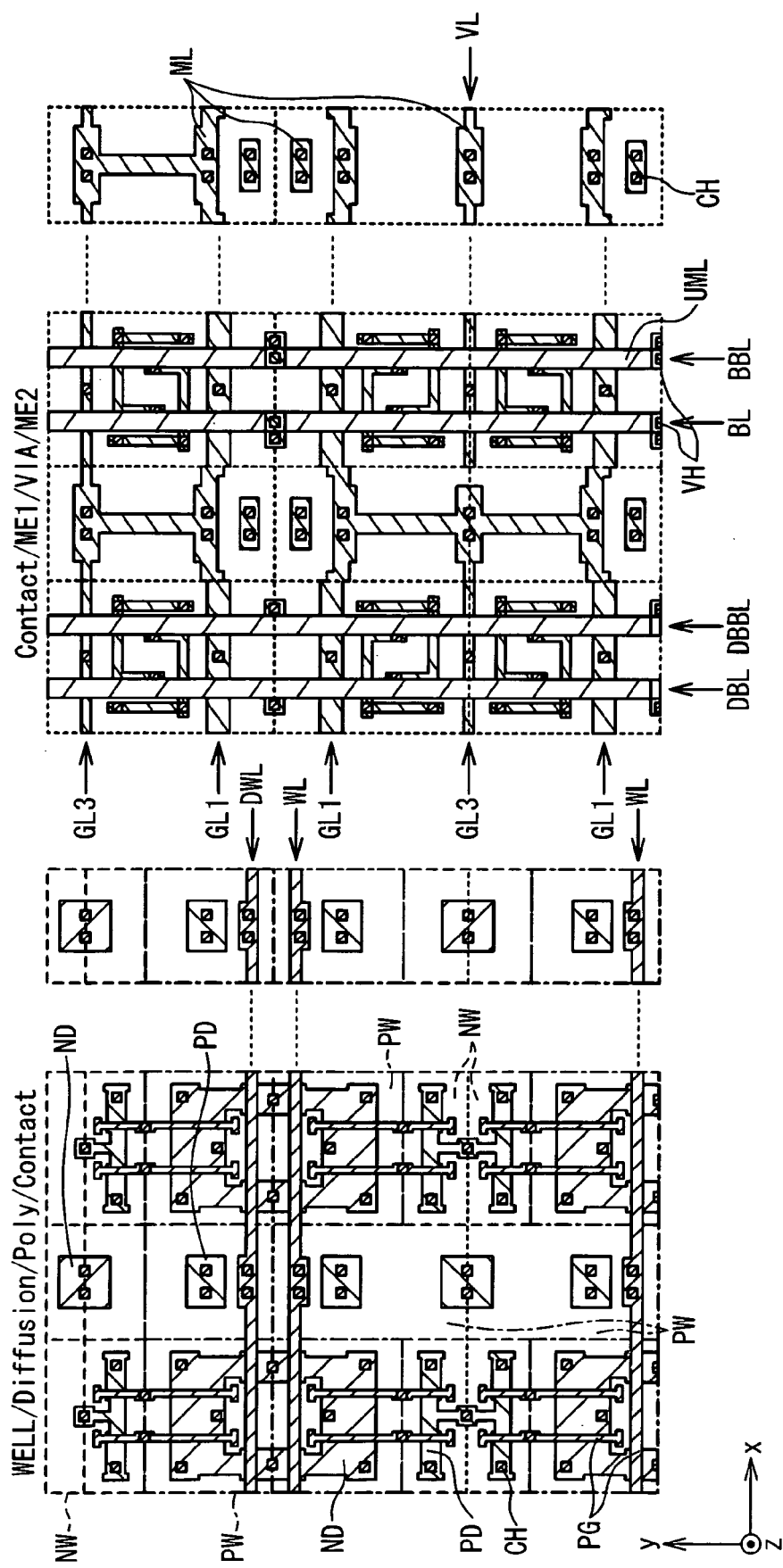
FIGS. 15A and 15B are diagrams showing the layouts of the cells in the SRAM in the second embodiment according to the present invention.

FIG. 14 is a diagram showing a configuration of a corner portion of the SRAM including the memory cells 100, the dummy memory cells 202, 211 and 221, and the Tap cells 300, 301 and 303 in the second embodiment. The cells having a diagonal line at a left lower portion are forward cells and the cells having a diagonal line at a left upper portion are reverse cells. The reverse cell is formed by reversing the forward cell with respect to the X direction. The reverse cell is indicated with a symbol ['].

In the SRAM, a row of the forward cells and a row of the reverse cells are alternately arranged to each other in the direction of the bit line, i.e., in the Y direction. The dummy memory cell region is arranged around a region of the memory cell array. A column of the dummy memory cells 202 is arranged in the Y direction in the outermost portion of the dummy memory cell region. In contrast, a row of the dummy memory cells 211 is arranged in the X direction in the outermost region of the dummy memory cell region. The dummy memory cell 221, which is a modification of the dummy memory cell 201, is arranged at a corner of the dummy memory cell region. A column of the Tap cells 303 is arranged between the column of the dummy memory cells 202 and the column of the memory cells 100, which are arranged in the Y direction. Additionally, the Tap cell 301 is arranged between the dummy memory cell 221 and the dummy memory cell 211 at the end of the column of the Tap cells 303. Moreover, a column of the Tap cells 300 is arranged every several columns of the memory cells 100. The Tap cell 301 is arranged between the dummy memory cells 221 at the end of the column of the Tap cells 301. The outermost dummy memory cells 211 and 221 and the outermost Tap cell 301 arranged in the X direction are the forward cells.

FIGS. 15A and 15B show layouts of a group of the cells surrounded by a dot line B in FIG. 14. FIG. 15A is a diagram showing the layout of the device section, and FIG. 15B is a diagram showing the layout of the wiring section arranged above the device section. Referring to FIG. 15B, the wiring section in the row of the dummy memory cell 221, the Tap cell 301, the dummy memory cell 211, . . . and the Tap cell 301 arranged in the X direction will be described. The metal wiring ML1 of the dummy memory cell 221, the metal wiring ML8 of the Tap cell 301, the metal wiring ML1-2 of the dummy memory cell 211 and the metal wiring ML8 of the Tap cell 301 are connected to be grounded, thereby forming the ground wiring GL3 of the substrate voltage GND. Furthermore, the metal wiring ML2 of the dummy memory cell 221, the metal wiring ML9 of the Tap cell 301, the metal wiring ML2-2 of the dummy memory cell 211 and the metal wiring ML9 of the Tap cell 301 are connected to be grounded, thereby forming the ground wiring GL1 of the substrate voltage GND. In this way, the sources of the dummy load transistors 21-1 and the dummy load transistors 22-1 of the dummy memory cell 211 and the dummy memory cell 221 are grounded.

Subsequently, the wiring section of a row of the dummy memory cell 202', the Tap cell 303', the memory cell 100', . . . and the Tap cell 300' arranged in the X direction will be described. The metal wiring ML2-2 of the dummy memory cell 202', the metal wiring ML15 of the Tap cell 303', the metal wiring ML2 of the memory cell 100' and the metal wiring ML6 of the Tap cell 300' are connected to be grounded, thereby forming the ground wiring GL1 of the substrate voltage GND. Moreover, the metal wiring ML1-2 of the dummy memory cell 202' and the metal wiring ML14 of the Tap cell 303' are connected to each other, and is grounded, thereby forming the ground wiring GL3 of the substrate voltage GND. The metal wiring ML14 of the Tap cell 303' and the metal wiring ML1 of the memory cell 100' are separated, while the metal wirings ML1 of the memory cells 100' and the metal wiring ML5 of the Tap cell 300' are connected to the power supply $V_{DD}$, thereby forming the power supply wiring VL of the power supply voltage $V_{DD}$. In this way, the sources of the dummy load transistors 21-1 of the dummy memory cell 202' are grounded in separation from the power supply.

Next, referring to FIG. 15A, the device sections in the row of the dummy memory cell 202', the Tap cell 303', the memory cell 100', . . . and the Tap cell 300' arranged in the X direction will be described. The well layer WELL of the Tap cell 303' adjacent to the N-type well NW of the memory cell 100' is the P-type well PW. As a consequence, an NP junction region is formed between the power supply wiring VL of the power supply voltage $V_{DD}$ and the ground wiring GL3 of the substrate voltage GND, thereby preventing any unnecessary current from flowing into the dummy memory cells 202' from the power supply wiring VL through the Tap cell 303'.

As described above, the sources of the dummy load transistors 21-1 of the dummy memory cells 202, 211 and 221 are separated from the power supply wiring VL, and are connected to the ground wiring GL. Therefore, any leakage current due to the power supply voltage $V_{DD}$ cannot be generated in the dummy memory cells 202, 211 and 221. Unlike the first embodiment, there is a case that a P-type well PW region of the Tap cell 302 adjacent to the N-type well NW region of the dummy memory cell 201 cannot be formed due to the miniaturization of the device section. Even in such a case, in the second embodiment, the SRAM can be produced by the use of the same P-type MOS transistor as the memory cell 100, without any leakage current due to the power supply voltage $V_{DD}$. That is, the SRAM has the device section of the same layout as or the similar layout to that of the memory cell 100. Furthermore, the use of the dummy memory cell having the same layout as or the similar layout to that of the memory cell 100 can produce a more excellent proximity effect.

Third Embodiment

Figure 16:
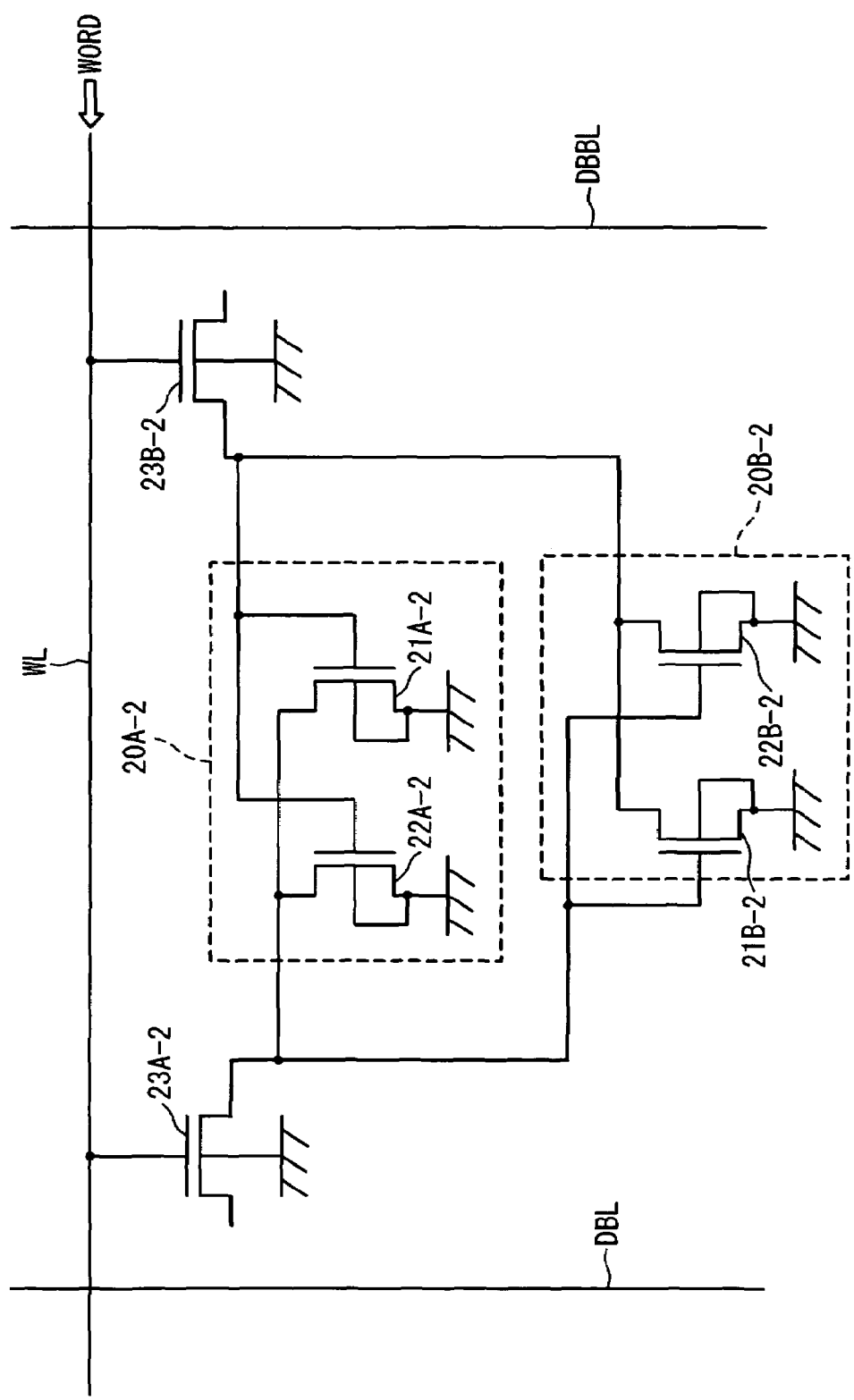
FIG. 16 is a circuit diagram showing a dummy memory cell arranged in a direction of the bit line in third and fourth embodiments according to the present invention.

Next, the SRAM according to the third embodiment of the present invention will be described below with reference to FIGS. 16 to FIGS. 21A and 21B. The SRAM in the third embodiment includes the memory cells 100, each of which uses the load transistors 11 of a P-type MOS transistor, and the dummy memory cells, each of which dummy load transistors 21 of the N-type MOS transistor. FIG. 16 is a circuit diagram showing the dummy memory cell 203 used in the SRAM in the third embodiment. The dummy memory cell 203 in the third embodiment is provided with dummy inverters 20-2 (20A-2 and 20B-2) corresponding to the inverters 10 (10A and 10B) in the memory cell and dummy access transistors 23-2 (23A-2 and 23B-2) corresponding to the access transistors 13 (13A and 13B). The dummy inverters 20A-2 and 20A-2 are cross-connected to each other, and the gates of the dummy access transistors 23A-2 and 23B-2 are connected to the word line WL.

Referring to FIG. 16, the dummy inverters 20-2 includes dummy load transistor 21-2 (21A-2 and 21B-2), which are the N-type MOS transistor, and dummy drive transistors 22-2 (22A-2 and 22B-2), which are the N-type MOS transistor. Sources of the dummy load transistors 21-2 and the dummy drive transistors 22-2 are grounded. A source of the dummy access transistor 23A-2 (or 23B-2) is separated from the dummy bit line DBL (or the dummy bit B line DBBL). A WORD signal is supplied to the word line WL.

Figure 17:
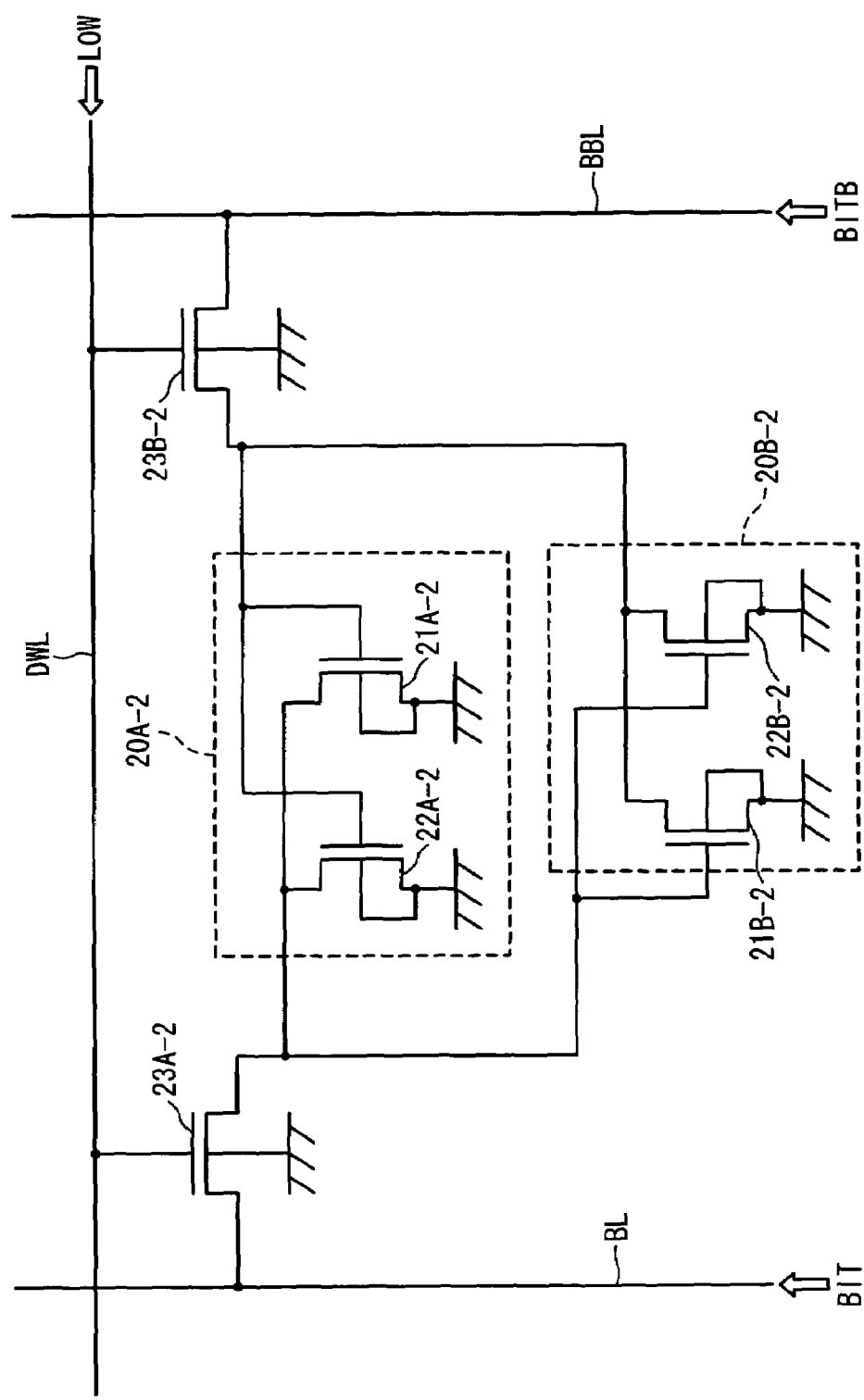
FIG. 17 is a circuit diagram showing a dummy memory cell arranged in a direction of the word line in the third embodiment according to the present invention.

FIG. 17 is a circuit diagram showing a dummy memory cell 212 in the third embodiment. In the dummy memory cell 212, a dummy word line DWL is provided in place of the word line in the configuration of the dummy memory cell 203, and further, the bit line BL and the bit B line BBL are provided in place of the dummy bit line DBL and the dummy bit B line DBBL, respectively. The bit signal BIT and the bit B signal BITB are supplied to the bit line BL and the bit B line BBL, respectively. The dummy inverters 20A-2 and 20B-2 are cross-connected to each other, and the dummy access transistors 23A-2 and 23B-2 are connected to the dummy word line DWL. The WORD signal of the Low level is supplied to the dummy word line DWL, so that the dummy access transistors 23A-2 and 23B-2 are always turned off. Moreover, a source of the dummy access transistor 23A-2 (or 23B-2) is connected to the bit line BL (or the bit B line BBL).

Figure 18B:
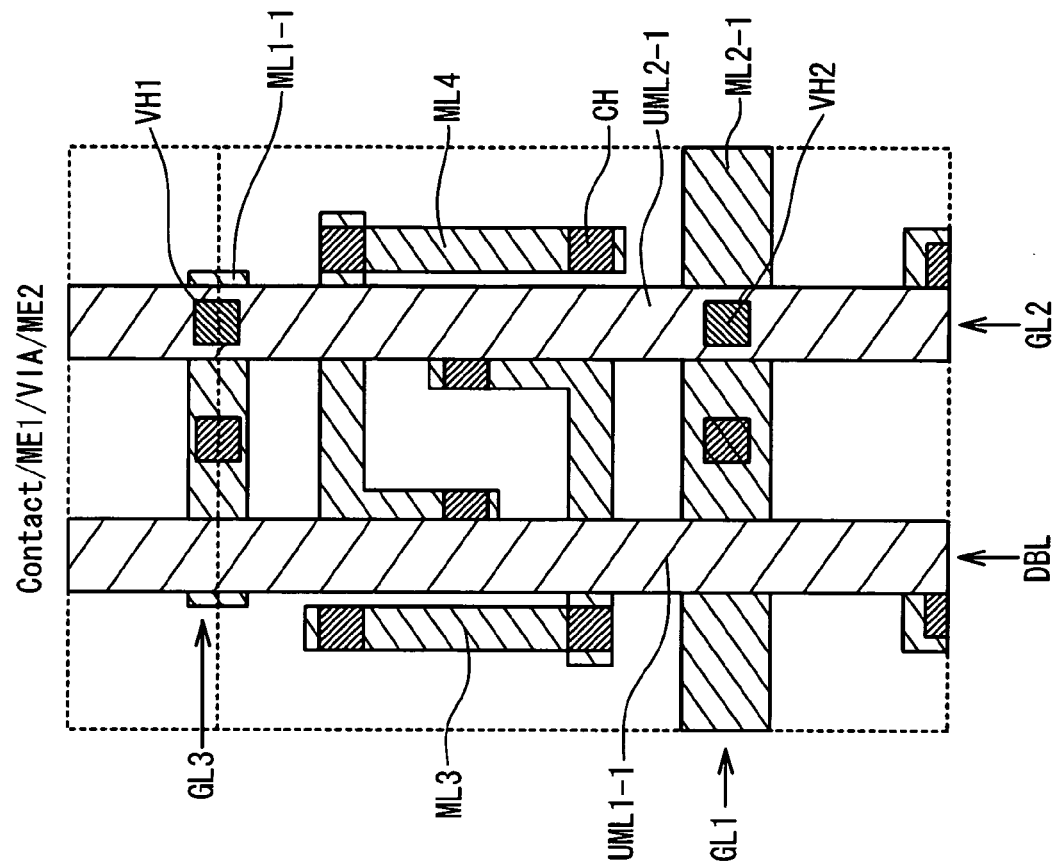
FIGS. 18A and 18B are diagrams showing layouts of the dummy memory cell arranged in the direction of the bit line in the third and fourth embodiments according to the present invention.
Figure 18A:
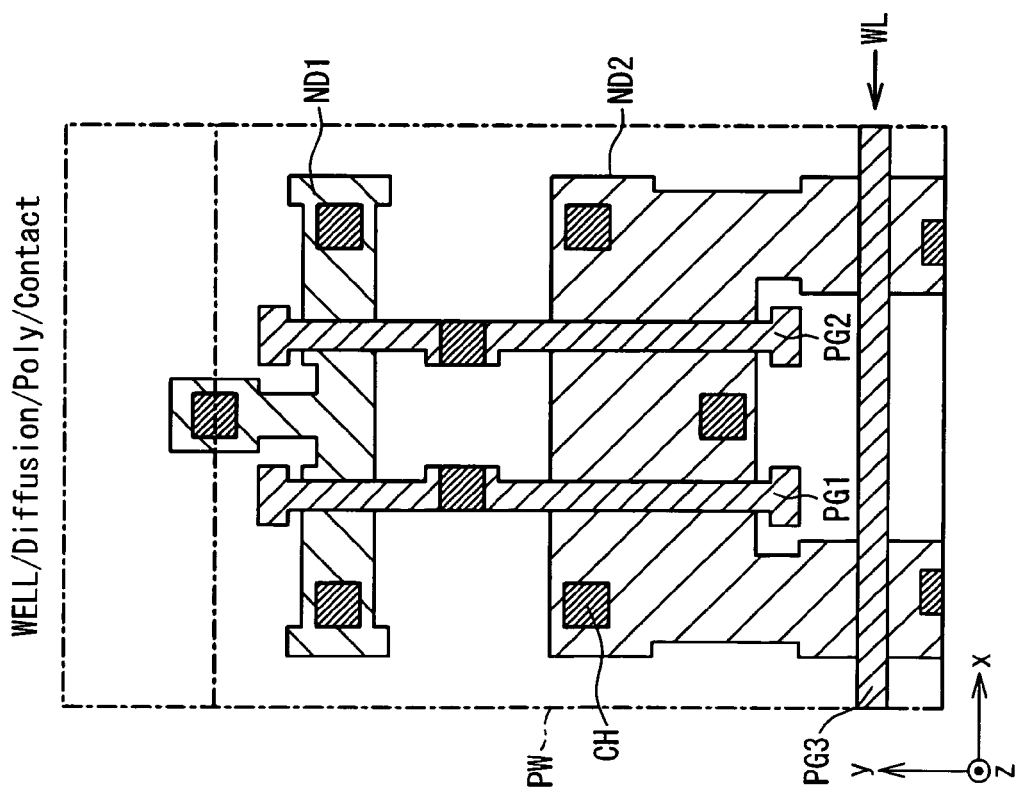

FIGS. 18A and 18B are diagrams showing layouts of the dummy memory cell 203. FIG. 18A is a diagram showing a layout of a device section which is provided with a well layer WELL, a diffusion layer Diffusion, a polysilicon layer Poly and a contact layer Contact. FIG. 18B is a diagram showing a layout of a wiring section which is provided with a first metal wiring layer ME1, a via-contact layer VIA and a second metal wiring layer ME2, which are laminated from the contact layer Contact of the device section.

Referring to FIG. 18A, the dummy memory cell 203 is provided with a well layer WELL including a P-type well PW and a diffusion layer Diffusion including N-type diffusion layers ND1 and ND2. Two polysilicon gates PG1 and PG2 are arranged in the Y direction across the N-type diffusion layers ND1 and ND2. In addition, the polysilicon gate PG3 serving as the word line WL extends in the X direction across the N-type diffusion layer ND in such a manner as to reach both ends of the dummy memory cell 203.

The N-type diffusion layer ND (ND1 and ND2) and the polysilicon gate PG (PG1 to PG3) form the N-type MOS transistors. That is to say, the N-type diffusion layer ND1 and the polysilicon gate PG1 form a dummy load transistor 21A-2, and the N-type diffusion layer ND1 and the polysilicon gate PG2 form a dummy load transistor 21B-2. Furthermore, the N-type diffusion layer ND2 and the polysilicon gates PG1 and PG2 form the N-type MOS transistors 22A-2 and 22B-2. In other words, the N-type diffusion layer ND2 and the polysilicon gate PG1 form the dummy drive transistor 22A-2 and the dummy access transistor 22B-2. Moreover, the N-type diffusion layer ND2 and the polysilicon gate PG2 form the dummy drive transistor 12B. Also, the N-type diffusion layer ND2 and the polysilicon gate PG3 form the dummy access transistors 23A-2 and 23B-2. A node of each of the gates, sources and drains of the transistors is connected to the metal wiring ML in the wiring section through the via-contact CH.

Referring to FIG. 18B, the metal wiring ML1-1 is designed in such a manner as not to reach both ends of the dummy memory cell 203, so that it is prevented from being connected to an adjacent Tap cell in the direction of the word line, i.e., in the X direction or the power supply wiring VL of the memory cell 100. The metal wiring ML2-1 extends in the X direction in such a manner as to reach both ends of the dummy memory cell, and is grounded, thereby forming the ground wiring GL1 of the substrate voltage GND. Furthermore, the metal wiring ML2-1 is connected to the sources of the dummy drive transistors 22A-2 and 22B-2 through the via-contact CH. The metal wiring ML3 is connected to a drain of each of the dummy load transistor 21A-2, the dummy drive transistor 22A-2 and the dummy access transistor 23A-2 and a gate of each of the dummy load transistor 21B-2 and the dummy drive transistor 22B-2 through the via-contacts CH. Additionally, the metal wiring ML4 is connected to a drain of each of the dummy load transistor 21B-2, the dummy drive transistor 22B-2 and the dummy access transistor 23B-2 and a gate of each of the dummy load transistor 21A-2 and the dummy drive transistor 22A-2 through the via-contacts CH. A via-contact VH2 is adopted to connect the ground wiring GL1 of the first wiring layer ME1 and the ground wiring GL2 of the second wiring layer ME2 to each other. The second wiring layer ME2 includes the dummy bit line DBL, i.e., an upper metal wiring UML1-1 and the ground wiring GL2, i.e., an upper metal wiring UML2-1 of the substrate ground GND, which extend in the Y direction. The ground wiring GL2 is connected to the metal wiring ML1-1 through the via-contact VH1. As a consequence, the sources of the dummy load transistors 21A-2 and 21B-2 are connected to the metal wiring ML1-1 serving as the ground wiring GL3 through the via-contact CH, and is grounded. Moreover, the sources of the dummy drive transistors 22A-2 and 22B-2 are connected to the ground wiring GL1 through the via-contact VH2 and the via-contact CH, and are grounded.

Figure 19B:
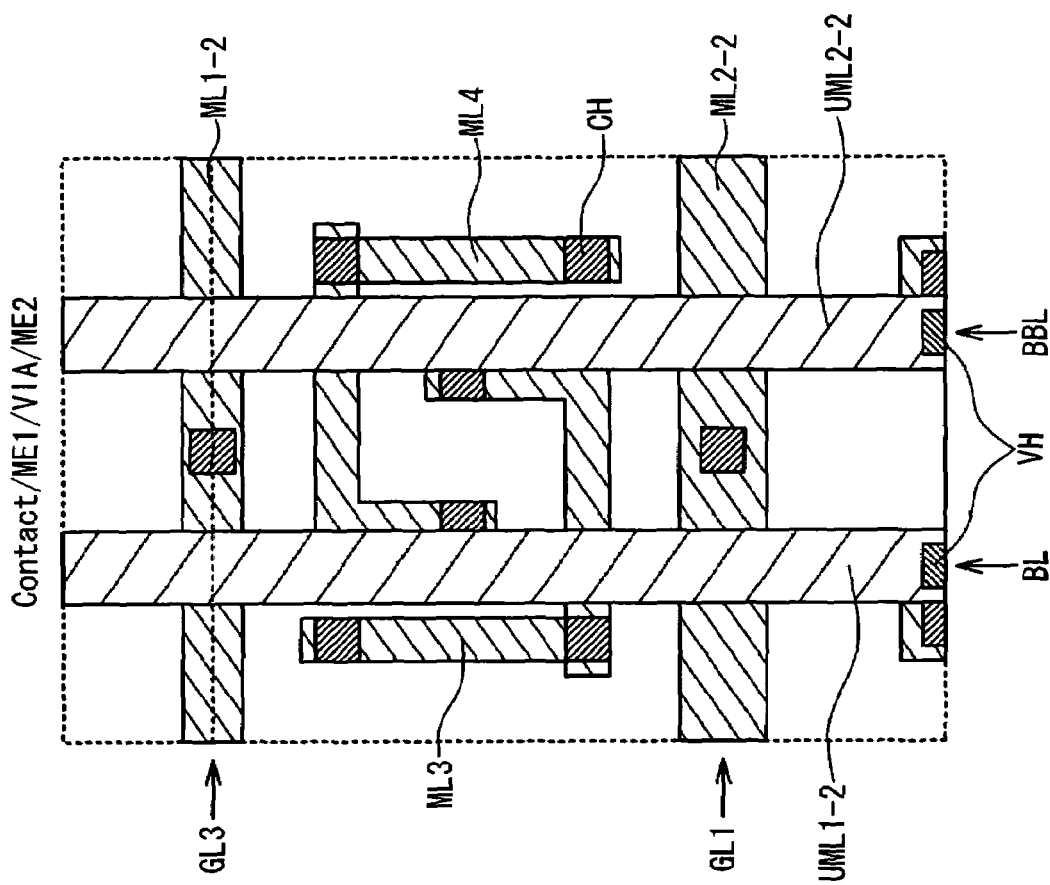
FIGS. 19A and 19B are diagrams showing layouts of the dummy memory cell arranged in the direction of the word line in the third and fourth embodiments according to the present invention.
Figure 19A:
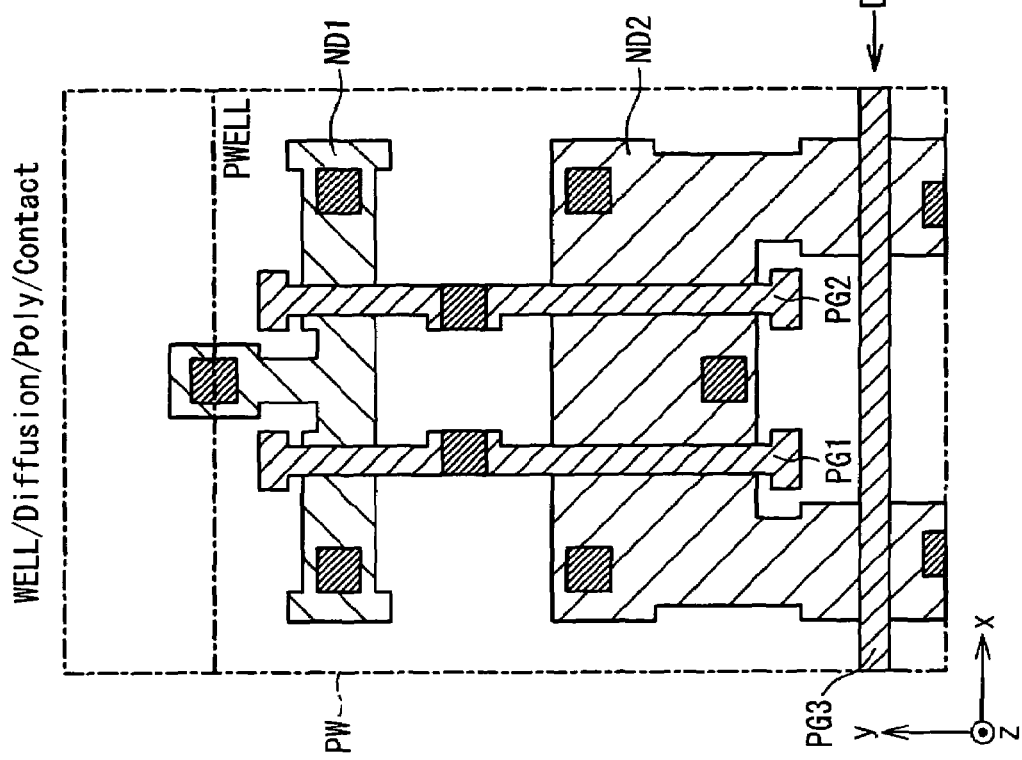

FIGS. 19A and 19B are diagrams showing layouts of the dummy memory cell 212 in the third embodiment. FIG. 19A shows the layout of a device section, and FIG. 19B shows the layout of a wiring section arranged above the device shown in FIG. 19A.

Referring to FIG. 19A, the layout of the device section in the dummy memory cell 212 is identical to the layout of the device section in the dummy memory cell 203 except that the signal of the Low level is supplied to the polysilicon PG3 serving as the dummy word line DWL. Referring to FIG. 19B, the metal wiring ML1-2 extends in the X direction in such a manner as to reach both ends of the dummy memory cell 212, and is grounded, thereby forming the ground wiring GL3 of the substrate voltage GND. Furthermore, the metal wiring ML1-2 is connected to the sources of the dummy load transistors 21A-2 and 21B-2 through the via-contact CH. The metal wiring ML2-2 extends in the X direction in such a manner as to reach both ends of the memory cell, and is grounded, thereby forming the ground wiring GL1 of the substrate voltage GND. Furthermore, the metal wiring ML2-2 is connected to the sources of the dummy drive transistors 22A-2 and 22B-2 through the via-contact CH. The metal wiring ML3 is connected to the drain of each of the dummy load transistor 21A-2, the dummy drive transistor 22A-2 and the dummy access transistor 23A-2 and the gate of each of the dummy load transistor 21B-2 and the dummy drive transistor 22B-2 through the via-contacts CH. Additionally, the metal wiring ML4 is connected to the drain of each of the dummy load transistor 21B-2, the dummy drive transistor 22B-2 and the dummy access transistor 23B-2 and the gate of each of the dummy load transistor 21A-2 and the dummy drive transistor 22A-2 through the via-contacts CH. The sources of the dummy access transistors 23A-2 and 23B-2 are connected to the bit line BL, i.e., the upper metal wiring UML1-2 and the bit B line BBL, i.e., the upper metal wiring UML2-2 through the via-contacts CH, the metal wirings ML and the via-contacts VH, respectively.

Figure 20:
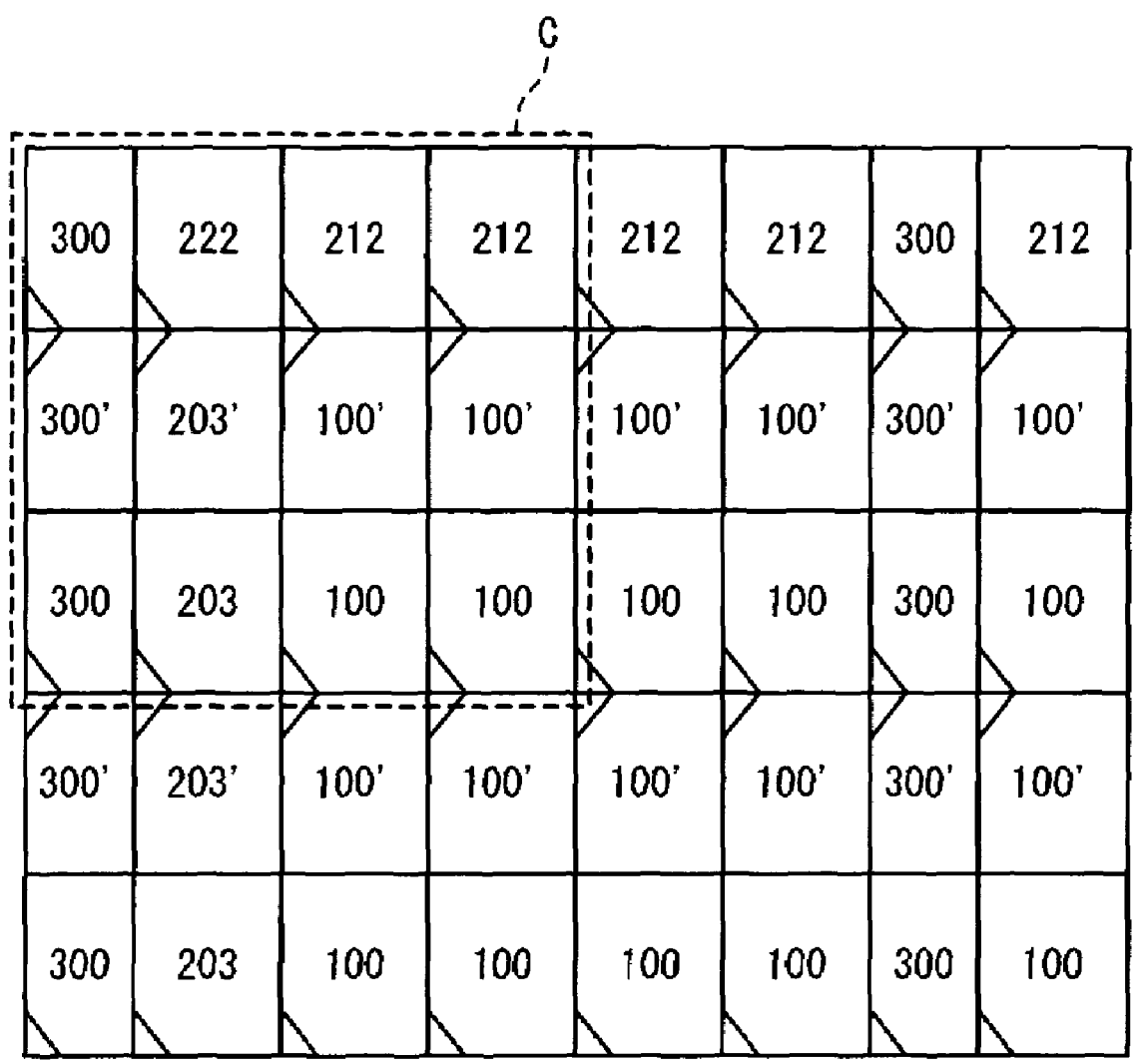
FIG. 20 is a diagram showing a layout of the cells in the SRAM in the third embodiment according to the present invention.

FIG. 20 is a diagram showing a configuration of a corner portion of the SRAM including the memory cell 100, the dummy memory cells 203, 212 and 222, and the Tap cell 300 in the third embodiment. The cell that has a diagonal line at lower left corner of the cell area is a forward cell. In contrast, the cell that has a diagonal line at the upper left corner of the cell is a reverse cell. The reference numeral of the reverse cell has an apostrophe attached to reference numeral of the forward cell.

In the SRAM, a row of the forward cells and a row of the reverse cells are arranged alternately in the direction of the bit line, i.e., in the Y direction. A dummy memory cell region is arranged around a region of the memory cell array. A column of the dummy memory cells 203 is arranged in the Y direction of the dummy memory cell region. In contrast, the dummy memory cell 212 is arranged in the X direction of the dummy memory cell region. The dummy memory cell 222, which is a modification of the dummy memory cell 203, is arranged at a corner of the dummy memory cell region. The dummy memory cells 203, 212 and 222 are arranged in one line in the dummy memory cell region in the present embodiment. However, the dummy memory cells 203, 212 and 222 may be preferably arranged in a plurality of lines. The dummy memory cells are arranged in a plurality of arrays, thereby effectively exhibiting the proximity effect of the layout.

Referring to FIG. 16, the circuit of the dummy memory cell 222 is configured by replacing the word line WL in the configuration of the dummy memory cell 203 with the dummy word line DWL. In addition, the layout of the device section is arranged such that the signal of the Low level is supplied to the polysilicon gate PG3 serving as the dummy word line DWL in the configuration of the dummy memory cell 203 referring to FIG. 18A. Moreover, the wiring section of the dummy memory cell 222 is configured such that the metal wiring ML1-1 in the dummy memory cell 203 extends toward the metal wiring ML1-2 in the dummy memory cell 212 arranged adjacently in the direction of the word line, i.e., in the X direction referring to FIG. 18B.

A column of the Tap cells 300 is arranged at the outermost portion of a dummy memory cell region, and extends in the Y direction. Moreover, the column of the Tap cells 300 is arranged every several columns of the memory cells 100. An interval between the columns of the Tap cells 300, i.e., the number of memory cells 100 between the columns of the Tap cells 300 in the X direction is determined such that the performance of all of the memory cells such as frequency characteristics and voltage characteristics can be sufficiently exhibited. Additionally, a row of the outermost dummy memory cells 212 and 222 and the outermost Tap cell 300 arranged in the X direction is the forward cells.

FIGS. 21A and 21B show the layouts of a group of the cells surrounded by a dot line C in FIG. 20. FIG. 21A is a diagram showing the layout of the device section which is provided with a well layer WELL, a diffusion layer Diffusion, a polysilicon layer Poly and a contact layer Contact. FIG. 21B is a diagram showing the layout of the wiring section which is provided with a contact layer Contact of the device, a first metal wiring layer ME1, a via-contact layer VIA and a second metal wiring layer ME2.

Referring to FIG. 21B, the wiring section in the column of the dummy memory cell 222, the dummy memory cell 203' and the dummy memory cell 203 . . . arranged in the Y direction will be described. The upper metal wiring UML2 of the dummy memory cell 222, the upper metal wiring UML2-1 of the dummy memory cell 203' and the upper metal wiring UML2-1 of the dummy memory cell 203 are connected to be grounded, thereby forming the ground wiring GL2 of the substrate voltage GND.

Subsequently, the wiring section in the row of the Tap cell 300, the dummy memory cell 222 and the dummy memory cell 212 . . . arranged in the X direction will be described. The metal wiring ML5 of the Tap cell 300 is connected to the power supply $V_{DD}$, thereby forming the power supply wiring VL. The metal wiring ML1 of the dummy memory cell 222 and the metal wiring ML1-2 of the dummy memory cell 212 are connected to be grounded, thereby forming the ground wiring GL3 of the substrate voltage GND. At this time, the metal wiring ML5 of the Tap cell 300 and the metal wiring ML1-1 of the dummy memory cell 222 are separated from each other. Furthermore, the metal wiring ML6 of the Tap cell 300, the metal wiring ML2-1 of the dummy memory cell 222 and the metal wiring ML2-2 of the dummy memory cell 212 are connected to be grounded, thereby forming the ground wiring GL1 of the substrate voltage GND. In this way, the sources of the dummy load transistors 21-2 of the dummy memory cell 212 and the dummy memory cell 222 is grounded.

Next, the wiring sections in the row of the Tap cell 300', the dummy memory cell 203' and the memory cell 100' . . . arranged in the X direction will be described. The metal wiring ML6 of the Tap cell 300', the metal wiring ML2-1 of the dummy memory cell 203' and the metal wiring ML2 of the memory cell 100' are connected one after another to be grounded, thereby forming the ground wiring GL1 of the substrate voltage GND. The metal wiring ML5 of the Tap cell 300' and the metal wiring ML1 of the memory cell 100' are connected to the power supply $V_{DD}$ I thereby forming the power supply wiring VL of the power supply voltage $V_{DD}$. Moreover, the metal wiring ML1-1 of the dummy memory cell 203' is separated from the metal wiring ML5 of the Tap cell 300' and the metal wiring ML1 of the memory cell 100', while the metal wiring ML1-1 of the dummy memory cell 203' is grounded through the ground wiring GL3, thereby forming the ground wiring GL3 of the substrate voltage GND. In this way, the sources of the dummy load transistors 21-2 of the dummy memory cell 203 and the dummy memory cell 203' are grounded in separation from the power supply $V_{DD}$.

Referring to FIG. 21A, the device section in the row of the Tap cell 300', the dummy memory cell 203' and the memory cells 100' . . . arranged in the X direction will be described. The well layer WELL of the dummy memory cell 203' adjacent to the N-type well NW of the memory cell 100' is the P-type well PW. In addition, the well layer WELL of the dummy memory cell 203' adjacent to the N-type well NW of the Tap cell 300' is the P-type well PW. As a consequence, the NPN junction region is formed between the power supply wiring VL of the power supply voltage $V_{DD}$ and the ground wiring GL3 of the substrate voltage GND, thereby preventing any unnecessary current from flowing into the device section in the dummy memory cell 203' from the power supply wiring VL through the memory cell 100' or the Tap cell 300'.

As described above, the sources of the dummy load transistors 21-2 in the dummy memory cells 203, 212 and 222 are separated from the power supply wiring VL, but are connected to the ground wiring GL3. Furthermore, the sources of the dummy drive transistors 22-2 are connected to the ground wiring GL1. Therefore, no leakage current due to the power supply voltage $V_{DD}$ can be generated in the dummy memory cells 203, 212 and 222. Thus, the operations of the memory cells can be stabilized, so that the defect rate of the SRAM can be reduced.

Fourth Embodiment

Next, the SRAM according to the fourth embodiment of the present invention will be described with reference to FIG. 22 to FIGS. 25A and 25B. In the SRAM in the fourth embodiment, a dummy memory cell 210 having the dummy load transistors 21A and 21B whose sources are connected to the power supply voltage $V_{DD}$ is arranged in the direction of the word line WL, and further the dummy memory cell 203 in the third embodiment is arranged in the direction of the bit line.

FIG. 22 is a circuit diagram showing the dummy memory cell 210 arranged in the direction of the word line WL. The dummy memory cell 210 is provided with the dummy inverters 20 (20A and 20B) corresponding to the inverters 10 in the memory cell 100 and the dummy access transistors 23 (23A and 23B) corresponding to the access transistors 13. The dummy inverters 20A and 20B are cross-connected to each other, and the gates of the dummy access transistors 23A and 23B are connected to the dummy word line DWL. In addition, the output terminal of the dummy inverter 20A is grounded. Moreover, the input terminal of the dummy inverter 20A connected to the drain of the dummy access transistor 23B and the output terminal of the dummy inverter 20B is connected to the source of the dummy load transistor 21A.

A source of the dummy access transistor 23A (or 23B) is separated from the bit line BL (or the bit B line BBL). Furthermore, the signal of the Low level is supplied to the dummy word line DWL, so that the dummy access transistors 23A and 23B are always turned off.

The dummy inverter 20 includes a dummy load transistor 21, which is the P-type MOS transistor, and a dummy drive transistor 22, which is the N-type MOS transistor. Sources of the dummy load transistors 21A and 21B and a drain of the dummy drive transistors 22B are connected to the power supply $V_{DD}$. Additionally, sources of dummy drive transistors 22A and 22B and a drain of the dummy drive transistor 22A are grounded.

FIGS. 23A and 23B are diagrams showing layouts of the dummy memory cell 210 having the circuit shown in FIG. 22. FIG. 23A is a diagram showing a layout of a device section which is provided with a well layer WELL, a diffusion layer Diffusion, a polysilicon layer Poly and a contact layer Contact. FIG. 23B is a diagram showing a layout of a wiring section which is provided with a first metal wiring layer ME1, a via-contact layer VIA and a second metal wiring layer ME2.

Referring to FIG. 23A, the layout of the device section in the dummy memory cell 210 is identical to the layout of the device in the memory cell 100 other than that the signal of the Low level is supplied to a polysilicon gate PG3 serving as the dummy word line DWL.

Referring to FIG. 23B, the wiring section is identical to the wiring section of the memory cell 100. In the first metal wiring layer ME1, a metal wiring ML1-0 extends in the X direction in such a manner as to reach both ends of the dummy memory cell, thereby forming the power supply wiring VL connected to the power supply $V_{DD}$. Moreover, the metal wiring ML1-0 is connected to the sources of the dummy load transistors 21A and 21B through the via-contact CH. The metal wiring ML2-0 is grounded in such a manner as to reach both ends of the dummy memory cell, thereby forming the ground wiring GL of the substrate voltage GND. Furthermore, the metal wiring ML2-0 is connected to the sources of the dummy drive transistors 22A and 22B through the via-contact CH. The metal wiring ML3-0 is connected to a drain of each of the dummy load transistor 21A, the dummy drive transistor 22A and the dummy access transistor 23A and a gate of each of the dummy load transistor 21B and the dummy drive transistor 22B through via-contacts CH. Additionally, the metal wiring ML4-0 is connected to a drain of each of the dummy load transistor 21B, the dummy drive transistor 22B and the dummy access transistor 23B and a gate of each of the dummy load transistor 21A and the dummy drive transistor 22A through via-contacts CH. In the second metal wiring layer, the bit line BL and the bit B line BBL extend in the Y direction in such a manner as to reach both ends of the cell. Additionally, the metal wiring ML4-0 of the dummy memory cell 210 is connected to the metal wiring ML1-0 serving as the power supply wiring VL, and is connected to the power supply $V_{DD}$. In addition, the metal wiring ML3-0 is connected to the metal wiring ML2-0 serving as the ground wiring GL, and is grounded.

Figure 24:
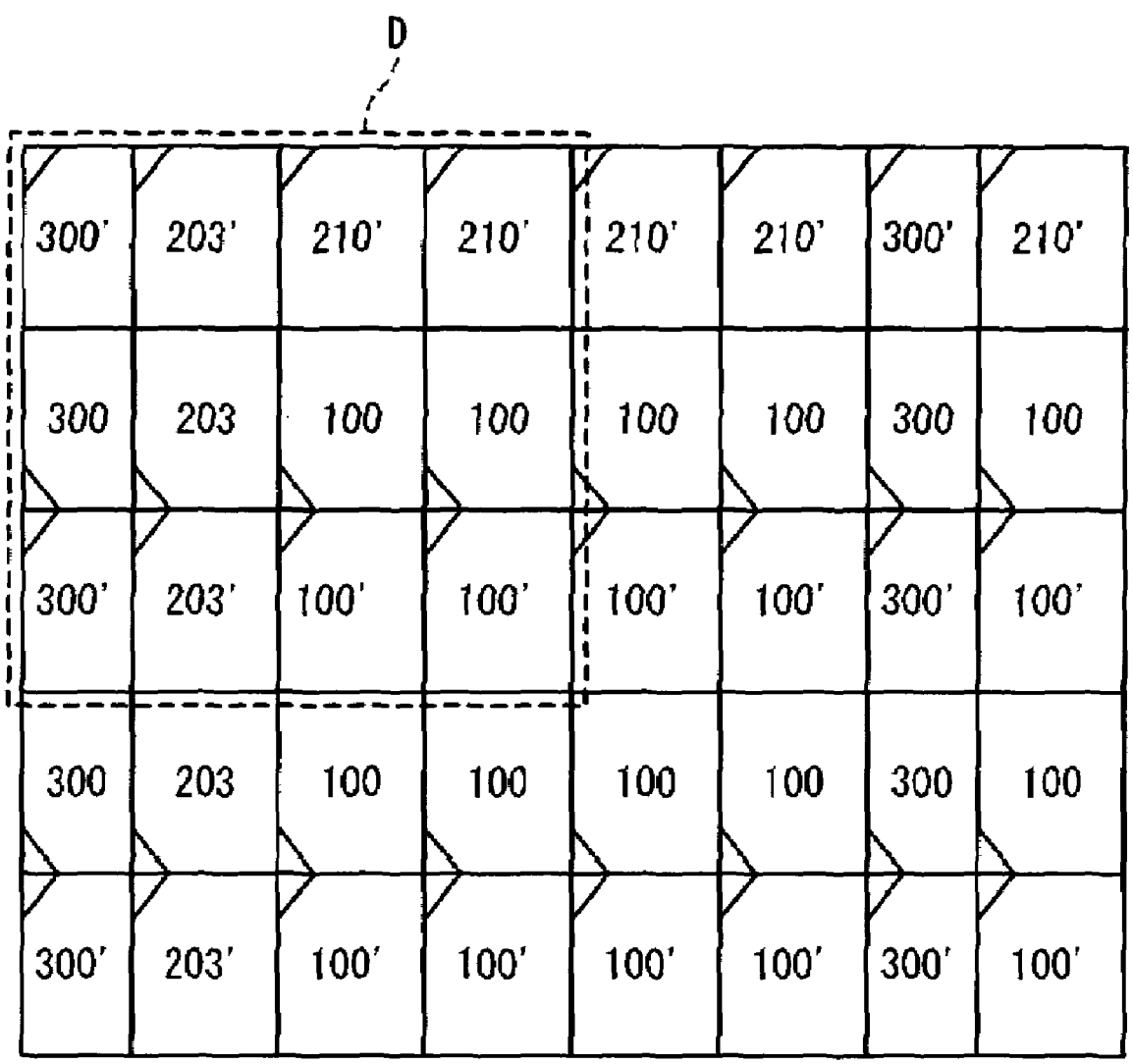
FIG. 24 is a diagram showing a layout of the cells in the SRAM in the fourth embodiment according to the present invention.

FIG. 24 is a diagram showing a configuration of a corner portion of the SRAM including the memory cells 100, the dummy memory cells 203 and 210, and the Tap cells 300 in the fourth embodiment. The cell having a diagonal line at the lower left corner is a forward cell. In contrast, the cell having a diagonal line at the upper left corner is a reverse cell. The reverse cell is obtained by reversing the forward cell with respect to the X direction. The reference numeral of the reverse cell has an apostrophe attached to reference numeral of the forward cell.

In the SRAM, a row the forward cells and a row of the reverse cells are alternately arranged adjacently to each other in the direction of the X direction. The dummy memory cell region is arranged outside of the memory cell array region. A column of the dummy memory cells 203 is arranged in the Y direction of the dummy memory cell region. In contrast, a row of the dummy memory cells 210 is arranged in the X direction of the dummy memory cell region. The column of the Tap cells 300 is arranged in the outer portion of the column of the dummy memory cells 203, which is arranged in the Y direction. Moreover, another column of the Tap cells 300 is arranged every several columns of the memory cells 100. An interval between the columns of the Tap cells 300, i.e., the number of the memory cells 100 between the number of Tap cells 300 in the X direction is determined such that the performance of all of the memory cells such as frequency characteristics and voltage characteristics can be sufficiently exhibited. Additionally, the outermost dummy memory cells 203 and 210 and the outermost Tap cell 300 arranged in the X direction are the reverse cells.

FIGS. 25A and 25B show layouts of a group of the cells surrounded by a dot line D in FIG. 24. FIG. 25A is a diagram showing the layout of the device section, and FIG. 25B is a diagram showing the layout of the wiring section arranged above the device section. Referring to FIG. 25B, the wiring section in the column of the dummy memory cells 203' . . . arranged in the Y direction will be described. The upper metal wirings UML2-1 of the dummy memory cells 203' and 203 are connected one after another to be grounded, thereby forming the ground wiring GL2 of the substrate voltage GND.

Subsequently, the wiring section in the row of the Tap cell 300', the dummy memory cell 203' and the dummy memory cell 210' . . . arranged in the X direction will be described. The metal wiring ML6 of the Tap cell 300', the metal wiring ML2-1 of the dummy memory cell 203' and the metal wiring ML2-0 of the dummy memory cells 210' are connected to be grounded, thereby forming the ground wiring GL1 of the substrate voltage GND. The metal wirings ML1-0 of the dummy memory cell 210' are connected to the power supply $V_{DD}$, thereby forming the power supply wiring VL. The metal wiring ML1-1 of the dummy memory cell 203' is grounded, thereby forming the ground wiring GL3 of the substrate voltage GND. At this time, the metal wiring ML1-1 of the dummy memory cell 203' is separated from the metal wiring ML5 of the Tap cell 300 and the metal wiring ML1-0 of the dummy memory cell 210'. In this manner, the sources of the dummy load transistors 21-2 of the dummy memory cell 203' is grounded, and the sources of the dummy load transistors 21 of the dummy memory cell 210' is connected to the power supply wiring VL.

Next, the wiring section in the row of the Tap cell 300, the dummy memory cell 203 and the memory cell 100 . . . arranged in the X direction will be described. The metal wirings ML1 of the memory cell 100 are connected to the power supply $V_{DD}$, thereby forming the power supply wiring VL of the power supply voltage $V_{DD}$. Moreover, the metal wiring ML1-1 of the dummy memory cell 203 is separated from the metal wiring ML5 of the Tap cell 300 and the metal wiring ML1 of the memory cell 100, and is grounded through the ground wiring GL2, thereby forming the ground wiring GL3 of the substrate voltage GND. Additionally, the metal wiring ML6 of the Tap cell 300, the metal wiring ML2-1 of the dummy memory cell 203 and the metal wiring ML2 of the memory cell 100 are connected to be grounded, thereby forming the ground wiring GL1 of the substrate voltage GND. In this way, the sources of the dummy load transistors 21-2 of the dummy memory cell 203 and the dummy memory cell 203' is grounded in separation from the power supply $V_{DD}$ and the sources of the dummy load transistors 21 of the dummy memory cell 210' is connected to the power supply wiring VL.

Referring to FIG. 25A, the device sections in the row of the Tap cell 300, the dummy memory cell 203 and the memory cell 100 . . . arranged in the X direction will be described. The well layer WELL of the dummy memory cell 203' adjacent to the N-type well NW of the memory cell 100 is the P-type well PW. In addition, the well layer WELL of the dummy memory cell 203' adjacent to the N-type well NW of the Tap cell 300' is the P-type well PW. As a consequence, the NPN junction region is formed between the power supply wiring VL of the power supply voltage $V_{DD}$ and the ground wiring GL3 of the substrate voltage GND, thereby preventing any unnecessary current from flowing into the dummy memory cell 203 from the power supply wiring VL through the memory cell 100 or the Tap cell 300.

As described above, in the SRAM of the fourth embodiment, the sources of the dummy load transistors 21 in the dummy memory cells 210 arranged in the direction of the word line WL are connected to the power supply wiring VL. However, the sources of the dummy load transistors 21-1 in the dummy memory cells 203 arranged in the direction of the bit line BL are separated from the power supply wiring VL, but are connected to the ground wiring GL3. Therefore, no leakage current due to the power supply voltage $V_{DD}$ can be generated in the dummy memory cell 203, although there remains a possibility of generation of a leakage current due to the power supply voltage $V_{DD}$ in the dummy memory cell 210. Thus, it is possible to eliminate the leakage current at a part of the dummy memory region, so that the operation of the memory cell can be more stabilized and the defect rate of the memory cells in the SRAM can be more reduced in comparison with the conventional SRAM.

Although the embodiments according to the present invention have been described above in detail, specific configurations are not limited to the above-described embodiments. The present invention encompasses modifications and alterations without departing from the scope of the present invention. In the above-described embodiments, the leakage current is prevented from being generated in the dummy memory cell by connecting the source of the dummy load transistor and the source of the dummy drive transistor to the substrate voltage GND. Alternatively, a leakage current may be prevented from being generated in a dummy memory cell by setting the source of the dummy load transistor and the source of the dummy drive transistor to the same voltage of the power supply voltage $V_{DD}$. Otherwise, the dummy load transistor may be replaced with the dummy load resistor. Or, the gate of the dummy load transistor in the above-described embodiments may be grounded.

What is claimed is:

1. A static semiconductor memory device comprising:
a memory cell formed in a memory cell region; and
a dummy memory cell formed in a dummy memory cell region,
wherein said memory cell comprises:
a power supply wiring and a ground wiring which are provided to extend in a direction of a word line; and
inverters provided between said power supply wiring and said ground wiring and cross-connected to each other,
said dummy memory cell comprises:
first and second wirings respectively corresponding to said power supply wiring and said ground wiring and extending in the direction of said word line; and
two sets of a dummy load circuit and a dummy drive transistor, wherein said two sets are connected with said first and second wirings, which are biased to prevent leakage current from flowing.

2. The static semiconductor memory device according to claim 1, wherein each of said dummy cell and said memory cell comprises:
a device section; and
a wiring section provided above said device section,
said wiring section of said memory cell comprises said power supply wiring and said ground wiring, and said wiring section of said dummy memory cell comprises said first and second wirings, and
said device section of said memory cell and said device section of said dummy memory cell have a same layout.

3. The static semiconductor memory device according to claim 1, wherein said first and second wiring are biased to a same voltage.

4. The static semiconductor memory device according to claim 1, wherein said first and second wiring are biased to different voltages.

5. The static semiconductor memory device according to claim 1, wherein said dummy drive transistor has a drain connected with one end of said dummy load circuit, and
the other end of said dummy load circuit is connected with said first wiring and a source of said dummy drive transistor is connected with said second wiring.

6. The static semiconductor memory device according to claim 5, wherein said dummy load circuit comprises a dummy load resistor.

7. The static semiconductor memory device according to claim 5, wherein said dummy load circuit comprises a dummy load transistor.

8. The static semiconductor memory device according to claim 7, wherein said dummy load transistor and said dummy drive transistor are of a same conductive type.

9. The static semiconductor memory device according to claim 7, wherein said dummy load transistor and said dummy drive transistor are of different conductive types.

10. The static semiconductor memory device according to claim 7, wherein one end of said dummy load circuit is connected with a drain of said dummy driver transistor, and the other end of said dummy load circuit and said source of said dummy drive transistor are connected with said first wiring and said second wiring, respectively.

11. The static semiconductor memory device according to claim 1, wherein said second wiring is connected to said ground wiring of said memory cell, and
said first wiring is separated from said power supply wiring of said memory cell.

12. The static semiconductor memory device according to claim 11, wherein said dummy memory cell comprises a third wiring extending in a direction perpendicular to the direction of said word line, and
said first and second wirings of said dummy memory cell are connected with said third wiring.

13. The static semiconductor memory device according to claim 1, where a column of said dummy memory cells is arranged in adjacent to a column of said memory cells through a column of Tap regions.

14. The static semiconductor memory device according to claim 13, where each of said Tap regions has a P well, which is biased to said ground voltage, said memory cell adjacent to said Tap region has an N well in which a p-type load transistor of each of said inverters connected with said power supply wiring is formed, and
said dummy memory cell has an N well biased to said ground voltage.

15. The static semiconductor memory device according to claim 1, where a column of Tap regions, a column of said dummy memory cells, and a column of said memory cells are arranged in this order.

16. The static semiconductor memory device according to claim 15, where said memory cell has an N well in which a p-type load transistor of each of said inverters connected with said power supply wiring is formed, and
said dummy memory cell has a P well in which an N-type transistor corresponding to the p-type load transistor and connected said ground voltage is formed.

17. A static semiconductor memory device comprising:
a memory cell formed in a memory cell region; and
a dummy memory cell formed in a dummy memory cell region,
wherein said memory cell comprises:
a power supply wiring and a ground wiring to supply a power supply voltage and a ground voltage, respectively; and
inverters connected between said power supply wiring and said ground wiring and cross-connected to each other,
said dummy memory cell comprises:
first and second wirings provided in correspondence to said power supply wiring and said ground wiring, respectively; and
two sets of a dummy load circuit and a dummy drive transistor, wherein said two sets are connected with said first and second wirings, and inputs and outputs of said two sets are cross-connected to each other,
wherein said dummy load circuit comprises a p-type dummy load transistor, and said dummy drive transistor is an n-type MOS transistor, and
sources of said dummy load transistor and said dummy drive transistor are respectively connected to said first and second wirings, which are connected with said ground voltage.

18. A static semiconductor memory device comprising:
a memory cell formed in a memory cell region; and
a dummy memory cell formed in a dummy memory cell region,
wherein said memory cell comprises:
a power supply wiring and a ground wiring to supply a power supply voltage and a ground voltage, respectively; and
inverters connected between said power supply wiring and said ground wiring and cross-connected to each other,
said dummy memory cell comprises:
first and second wirings provided in correspondence to said power supply wiring and said ground wiring, respectively; and
two sets of a dummy load circuit and a dummy drive transistor, wherein said two sets are connected with said first and second wirings, and inputs and outputs of said two sets are cross-connected to each other,
wherein said dummy load circuit comprises an n-type dummy load transistor, and said dummy drive transistor is an n-type MOS transistor, and
sources of said dummy load transistor and said dummy drive transistor are respectively connected to said first and second wirings, which are connected with said ground voltage.

19. A static semiconductor memory device comprising:
a memory cell formed in a memory cell region; and
a dummy memory cell formed in a dummy memory cell region,
wherein said memory cell comprises:
a power supply wiring and a ground wiring to supply a power supply voltage and a ground voltage, respectively; and
inverters connected between said power supply wiring and said ground wiring and cross-connected to each other,
said dummy memory cell comprises:
first and second wirings provided in correspondence to said power supply wiring and said ground wiring, respectively; and
two sets of a dummy load circuit and a dummy drive transistor, wherein said two sets are connected with said first and second wirings, and inputs and outputs of said two sets are cross-connected to each other,
wherein said dummy load circuit comprises a p-type dummy load transistor, and said dummy drive transistor is an n-type MOS transistor,
sources of said dummy load transistor and said dummy drive transistor are respectively connected to said first and second wirings, which are respectively connected with said power supply voltage and said ground voltage, and
a set of said input of one set and said output of the other set is connected to said ground voltage, and a set of said input of the other set and said output of said one set is connected to said power supply voltage.

20. A static semiconductor memory device comprising:
a memory cell formed in a memory cell region; and
a dummy memory cell formed in a dummy memory cell region,
wherein said memory cell comprises:
a power supply wiring and a ground wiring to supply a power supply voltage and a ground voltage, respectively; and
inverters connected between said power supply wiring and said ground wiring and cross-connected to each other,
said dummy memory cell comprises:
first and second wirings provided in correspondence to said power supply wiring and said ground wiring, respectively; and
two sets of a dummy load circuit and a dummy drive transistor, wherein said two sets are connected with said first and second wirings, and inputs and outputs of said two sets are cross-connected to each other,
wherein said first and second wiring are biased to a same voltage.

* * * * *